(12) United States Patent
Kudo

(10) Patent No.: US 6,228,670 B1
(45) Date of Patent: May 8, 2001

(54) METHOD OF MANUFACTURING A SEMICONDUCTOR OPTICAL WAVEGUIDE ARRAY AND AN ARRAY-STRUCTURED SEMICONDUCTOR OPTICAL DEVICE

(75) Inventor: Koji Kudo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/298,229

(22) Filed: Apr. 22, 1999

(30) Foreign Application Priority Data

Apr. 23, 1998 (JP) .................................................. 10-113051

(51) Int. Cl.$^7$ .................................................. H01L 21/20
(52) U.S. Cl. .................................................. 438/31; 438/44
(58) Field of Search .................................................. 438/22, 31, 41, 438/44, 46, 47; 385/129, 14, 131–132; 257/94

(56) References Cited

U.S. PATENT DOCUMENTS

| | | | |
|---|---|---|---|
| 5,157,796 | * 10/1992 | Tobita ...................................... | 385/33 |
| 5,565,693 | * 10/1996 | Sasaki et al. ........................... | 257/94 |
| 5,633,966 | * 5/1997 | Nakaishi ................................. | 885/37 |
| 5,736,429 | * 4/1998 | Tregoat et al. ......................... | 438/31 |
| 5,914,694 | * 6/1999 | Rabo ...................................... | 343/771 |
| 5,991,490 | * 11/1999 | Mizuuchi et al. ..................... | 385/136 |
| 5,995,055 | * 11/1999 | Milroy ................................... | 343/772 |
| 6,036,771 | * 3/2000 | Sakata .................................... | 117/89 |
| 6,037,105 | * 3/2000 | You et al. .............................. | 430/321 |
| 6,134,368 | * 10/2000 | Sakata .................................... | 385/31 |

FOREIGN PATENT DOCUMENTS 8-153928   6/1996  (JP) .

OTHER PUBLICATIONS

1997 IEICE Electronics Society Transactions 1 C–3–103. (See p. 33 of the specification for a discussion of this Japanese reference).

C.E. Zah, et al., "1.5 $\mu$m Compressive–Strained Multiquantum–Well 20–Wavelength Distributed–Feedback Laser Arrays", *Electronics Letters*, vol. 28, No. 9, Apr. 23, 1992, pp. 824–826.

* cited by examiner

*Primary Examiner*—Savitri Mulpuri
(74) *Attorney, Agent, or Firm*—Ostrolenk, Faber, Gerb & Soffen, LLP

(57) ABSTRACT

In a method of manufacturing a semiconductor optical waveguide array in an ultra-high integration, the device yield per wafer is considerably increased and uniform and improved characteristics are obtained. In this method, there is manufactured a semiconductor optical waveguide array including a plurality of optical waveguides in an array structure in stripe-shaped growth regions enclosed by dielectric thin films on a substrate. The waveguides are fabricated through a selective crystal growth process and include a semiconductor multilayer structure including a quantum well layer or a semiconductor multilayer structure including a bulk layer. Namely, there is formed a plurality of stripe-shaped growth regions elongated parallel to each other, the regions being enclosed with a dielectric thin film. In each growth region, a semiconductor multilayer structure is selectively grown by metallo-organic vapor phase epitaxy (MOVPE). In the selective growth, the growth regions are parallel to each other with an interval therebetween, the interval being less than a diffusion length of a source material in a reactive tube during the crystal growth. Assuming that the dielectric thin film arranged between the respective growth regions has a width Wa and a first outer-most dielectric thin film and a second outer-most dielectric thin film arranged respectively outside of outer-most ones of the growth regions respectively have widths $W_{m1}$ and $W_{m2}$, there is satisfied a relationship of $W_{m1}$>Wa and $W_{m2}$>Wa.

8 Claims, 18 Drawing Sheets

F I G. 9
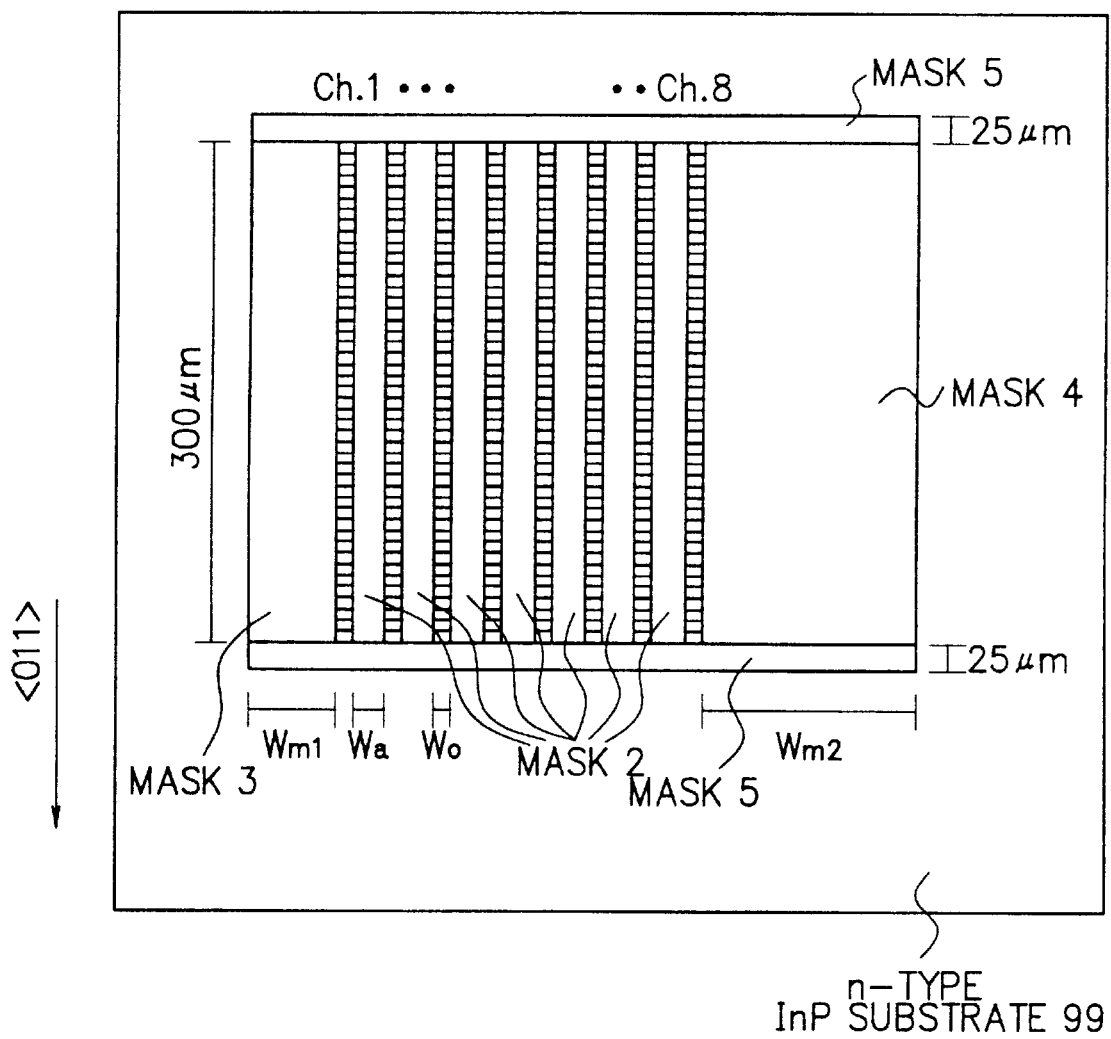

METHOD OF MANUFACTURING A SEMICONDUCTOR OPTICAL WAVEGUIDE ARRAY AND AN ARRAY-STRUCTURED SEMICONDUCTOR OPTICAL DEVICE

BACKGROUND OF THE INVENTION

The present invention relates to a method of manufacturing a semiconductor optical waveguide array and an array-structured semiconductor optical device, and in particular, a method of manufacturing a semiconductor optical waveguide array and an array-structured semiconductor optical device in which the array has a uniform optical device characteristic and the array is considerably minimized in size when compared with that of conventional technology.

Description of the Prior Art

For the practical use of an optical communication system employing a wavelength-division multiplexing (WDM), it is essential to develop a technology to supply such key devices at a low cost as an light source with multiple wavelengths and a wavelength selective light source. Particularly, the wavelength selective light source, which enables system users to select an arbitrary oscillation wavelength, is one of the light sources especially suitable for practical uses of the system because it is quite easy to operate.

To manufacture a wavelength selective light source, there has been considered a technology in which a plurality of optical sources having mutually different wavelengths are integrally fabricated in one chip in a monolithic form. As an example of such devices, a different wavelength semiconductor laser array has been developed.

In pages 824 and 825 of the "IEE Electronics Letters", Vol. 28, No. 9 (to be referred to as Literature 1 hereinafter), one of the representative methods of fabricating a semiconductor laser array with different wavelengths has been described.

In the method, an active layer such as a multi-quantum well (MQW) and an optical waveguide layer or the like are grown on an InP wafer by an ordinary process such as metallo-organic vapor phase epitaxy (MOVPE), and then diffraction gratings having mutually different periods are fabricated on the optical waveguide layer by electron beam exposure or the like.

Thereafter, a current block structure is formed by embedding resistors having high resistance and constructing semiconductor lasers of the laser array are processed respectively and electrically separated from each other by dry etching and the like so as to complete a different wavelength semiconductor laser array.

In the laser array, by using different pitch diffraction gratings, the respective semiconductor lasers of the array can be oscillated with mutually different wavelengths, i.e., Bragg wavelengths of the respective diffraction gratings.

However, a gain peak wavelength of the MQW active layer is fixed in the array manufactured in this method. Therefor, the Bragg wavelength of the semiconductor laser determined by the diffraction grating pitch varies. Hence there appears a shift or difference relative to the gain peak wavelength, there arises a problem of deterioration of laser characteristics such as an optical output power at oscillation and threshold current of the laser. This leads to disadvantages as follows. Namely, it is impossible to obtain the desired favorable laser characteristics from all the semiconductor lasers composing the different wavelength semiconductor laser array.

The above problem can be removed by a method of manufacturing a different-wavelength semiconductor laser array described in Japanese Patent Laid-Open Application No. 8-153928 (to be referred to as Literature 2 hereinafter). In the method, a selective growth is employed to fabricate an MQW active layer forming the gain of the semiconductor laser.

In accordance with this method, the gain peak wavelength of the MQW active layer can continuously follow an oscillation wavelength of each semiconductor laser determined by a diffraction grating. It is performed to obtain the desired steady and preferable laser characteristics such as low threshold current and high output power from all semiconductor lasers composing different-wavelength oscillation laser array.

As described above, in order to implement a different wavelength semiconductor laser array having favorable characteristics. There are essentially required 1) a technology to fabricate a different pitch diffraction grating to change the oscillation wavelength and 2) a technology to make the gain peak wavelength of the MQW active layer continuously follow any change in each Bragg wavelength of the different pitch diffraction grating.

From this viewpoint, the technology disclosed of Literature 2, namely, a manufacturing method in which 1) the electron beam exposing technology and 2) the selective growing technology are combined with each other can be regarded as a technology to satisfy two necessary conditions for the fabrication of a high-performance different wavelength semiconductor laser array.

However, the array-structured semiconductor optical devices such as the different wavelength semiconductor laser array fabricated in the method of Literature 2 are attended with a fatal problem when the devices are required to be supplying at a low cost. That is, the array-structured semiconductor optical device is increased in size.

When the manufacturing method of Literature 2 is employed to fabricate a different wavelength semiconductor laser array, the semiconductor laser devices of the array are separated by a distance of about 250 micrometers ($\mu$m). As a result, when a different wavelength semiconductor laser array including 8 lasers each having a cavity length of about 300 $\mu$m for eight wavelengths is manufactured, the overall size of the array device becomes about 2 millimeters (mm)× 300 $\mu$m.

This is because that the selective growth technology described in Literature 2 requires an about 40 $\mu$m wide dielectric mask between the optical waveguides structuring the array. Namely, to prevent influence from taking place between the dielectric masks of the adjacent optical waveguides of the array, an array interval of at least about 200 $\mu$m is required. In consequence, in the method of manufacturing a different wavelength semiconductor laser array of Literature 2, it is inherently impossible to minimize the array interval.

Consequently, the yield of array devices per wafer is about ⅛ or less that of semiconductor laser devices per wafer. This greatly increases the manufacturing cost and hence results in a serious problem in practical applications of the array-structured semiconductor device such as a different wavelength semiconductor array.

The conventional methods of fabricating a different wavelength semiconductor laser array described in Literature 1 and 2 are therefore attended with problems as follows. 1) It is impossible to obtain desired excellent and uniform characteristics for all semiconductor lasers of the array.

Moreover, 2) the device size of the array becomes greater, the wafer yield per wafer is lowered, and the device cost is conspicuously soared.

SUMMARY OF THE INVENTION

It is therefore an object of the present invention, which has been devised in consideration of the problems above, to provide a method of manufacturing a semiconductor optical waveguide array capable of minimizing the array size and a array-structured semiconductor optical device including a semiconductor optical waveguide array in a fine structure in which desired excellent and uniform characteristics can be obtained.

The present inventor determined widths of dielectric thin films through various experiments including Experimental Examples 1 to 3, which will be described later, to minimize the array size. Additionally, it has been found that uniform characteristics can be obtained in the optical devices by changing the composition and layer thickness between adjacent optical waveguides of the array, which results in the present invention.

To achieve the above-described object in accordance with the present invention, there is provided a method of manufacturing a semiconductor optical waveguide array including a plurality of optical waveguides in an array structure in stripe-shaped growth regions enclosed by dielectric thin films on a substrate, the optical waveguide being fabricated through a selective crystal growth and having a semiconductor multilayer structure including a quantum well layer or a semiconductor multilayer structure including a bulk layer, comprising the following steps of, on an occasion of fabricating a plurality of stripe-shaped growth regions elongated parallel to each other, the regions being enclosed with dielectric thin films and selectively growing in each of the growth regions by metallo-organic vapor phase epitaxy a semiconductor multilayer structure including a quantum well layer or a semiconductor multilayer structure including a bulk layer, the growth regions being parallel to each other with an interval therebetween in the selective growing step the interval being less than a diffusion length of a source material in a reactive tube during the crystal growth, the dielectric thin films arranged between the respective growth regions each having a width Wa, a first outer-most dielectric thin film and a second outer-most dielectric thin film arranged respectively outside of outer-most ones of the growth regions respectively having widths $W_{m1}$ and $W_{m2}$, the widths Wa, $W_{m1}$ and $W_{m2}$ satisfying a relationship of $W_{m1} > Wa$ and $W_{m2} > Wa$.

In accordance with the present invention, the method of manufacturing a semiconductor optical waveguide array further includes the step of setting the widths $W_{m1}$ and $W_{m2}$ respectively of the first and second outer-most dielectric thin films to values satisfying a condition of $W_{m1} \neq W_{m2}$ and thereby changing composition or a thickness of each of the semiconductor optical waveguides of the array.

In accordance with the present invention, the method of manufacturing a semiconductor optical waveguide array includes the step of completely covering by the dielectric thin film each of the regions enclosed by the plural growth regions.

In accordance with the present invention, the method of manufacturing a semiconductor optical waveguide array includes the step of setting an interval between the plural growth regions to 50 μm or less.

In accordance with the present invention, the method of manufacturing a semiconductor optical waveguide array includes the step of setting a length of each of the plural growth regions to 10 μm or less.

In accordance with the present invention, the method of manufacturing a semiconductor optical waveguide array includes the step of changing either one of the number of the growth regions and the widths Wa, $W_{m1}$, and $W_{m2}$ of the dielectric thin films in a longitudinal direction of the growth regions and thereby changing composition or a thickness of each of the semiconductor optical waveguides of the array in the longitudinal direction.

In accordance with the present invention, the method of manufacturing a semiconductor optical waveguide array includes the step of changing each interval between the plural growth regions in a longitudinal direction of the growth regions and thereby changing an interval between the semiconductor optical waveguides.

In accordance with the present invention, the method of manufacturing a semiconductor optical waveguide array includes the step of setting at least either one of a width of each of the growth regions, a width of each of the growth regions, and the widths Wa, $W_{m1}$, and $W_{m2}$ of the dielectric thin films to vary between semiconductor optical waveguide arrays formed on the substrate.

Furthermore, to achieve the object above in accordance with the present invention, there is provided an array-structured semiconductor optical device, including an optical waveguides in an array structure in stripe-shaped growth regions enclosed by dielectric thin films on a substrate, the optical waveguides being fabricated through a selective crystal growth and having a semiconductor multilayer structure including a quantum well layer or a semiconductor multilayer structure including a bulk layer, the optical waveguides being formed a plurarity of optical waveguides in an array structure with an interval therebetween, the interval being less than a diffusion length of a source material in a reactive tube during the crystal growth.

In the array-structured semiconductor optical device in accordance with the present invention, the optical waveguides are arranged in an array structure with an interval equal to or less than 50 μm.

In the array-structured semiconductor optical device in accordance with the present invention, each of the optical waveguides includes side walls, the wall including a (111)B crystal surface selectively grown.

In the array-structured semiconductor optical device in accordance with the present invention, at least one selected from a band gap energy and a layer thickness of the crystal selectively grown varies between adjacent ones of the optical waveguides.

In the array-structured semiconductor optical device in accordance with the present invention, the optical waveguides in an array structure include a semiconductor bulk active layer and have a function of an optical amplifier for attaining an optical gain in response to a current injection thereto.

In the array-structured semiconductor optical device in accordance with the present invention, the optical waveguides in an array structure include a different quantum well (MQW) layer and have a light reflection mechanism at both ends of the waveguides or in a proximity thereof. The waveguides conducts a laser oscillation when an optical gain is attained in response to a current injection thereto.

In the array-structured semiconductor optical device in accordance with the present invention, the light reflecting function is conducted by a diffraction grating arranged in a proximity of the optical waveguides.

In accordance with the present invention, the diffraction grating has a period varying between adjacent ones of the optical waveguides.

In the array-structured semiconductor optical device in accordance with the present invention, there further included a light spot size converter integrated at least at one end of the optical waveguides.

In the array-structured semiconductor optical device in accordance with the present invention, there is further included an optical multiplexer such as a star coupler, a different mode interference (MMI) unit at least at one end of the optical waveguides.

In accordance with the present invention, there is provided a different wavelength light source of complex resonator type, including an array-structured semiconductor optical device in which the optical waveguides in an array structure include a semiconductor bulk active layer and have a function of an optical amplifier for attaining an optical gain in response to a current injection thereto. The light source further includes a quartz-based planar lightwave circuit (PLC) including diffraction gratings and the like. The PLC is integrated with the optical device in a hybrid configuration.

In accordance with the present invention, there is provided an optical module, including at least one array-structured semiconductor optical device. The device includes a substrate, stripe-shaped growth regions enclosed by dielectric thin films on the substrate, and optical waveguides fabricated through a selective crystal growth. The waveguides include a semiconductor multilayer structure including a quantum well layer or a semiconductor multilayer structure including a bulk layer. The optical waveguides are formed in an array structure with an interval therebetween, which is less than a diffusion length of a source material in a reactive tube during the crystal growth.

In accordance with the present invention, there is provided an optical communication system, including at least one array-structured semiconductor optical device. The device includes a substrate, stripe-shaped growth regions enclosed by dielectric thin films on the substrate, and optical waveguides fabricated through a selective crystal growth. The waveguides include a semiconductor multilayer structure including a quantum well layer or a semiconductor multilayer structure including a bulk layer. The optical waveguides are formed in an array structure with an interval therebetween, which is less than a diffusion length of a source material in a reactive tube during the crystal growth.

Favorably, at least one of the band gap energy of the optical waveguide selectively grown and the layer thickness of the waveguide varies between the adjacent optical waveguides.

BRIEF DESCRIPTION OF THE DRAWINGS

The objects and features of the present invention will become more apparent from the consideration of the following detailed description taken in conjunction with the accompanying drawings in which:

FIG. 9 is a plan view of a mask used in the first embodiment;

DESCRIPTION OF THE PREFERRED EMBODIMENTS

Figure 1:
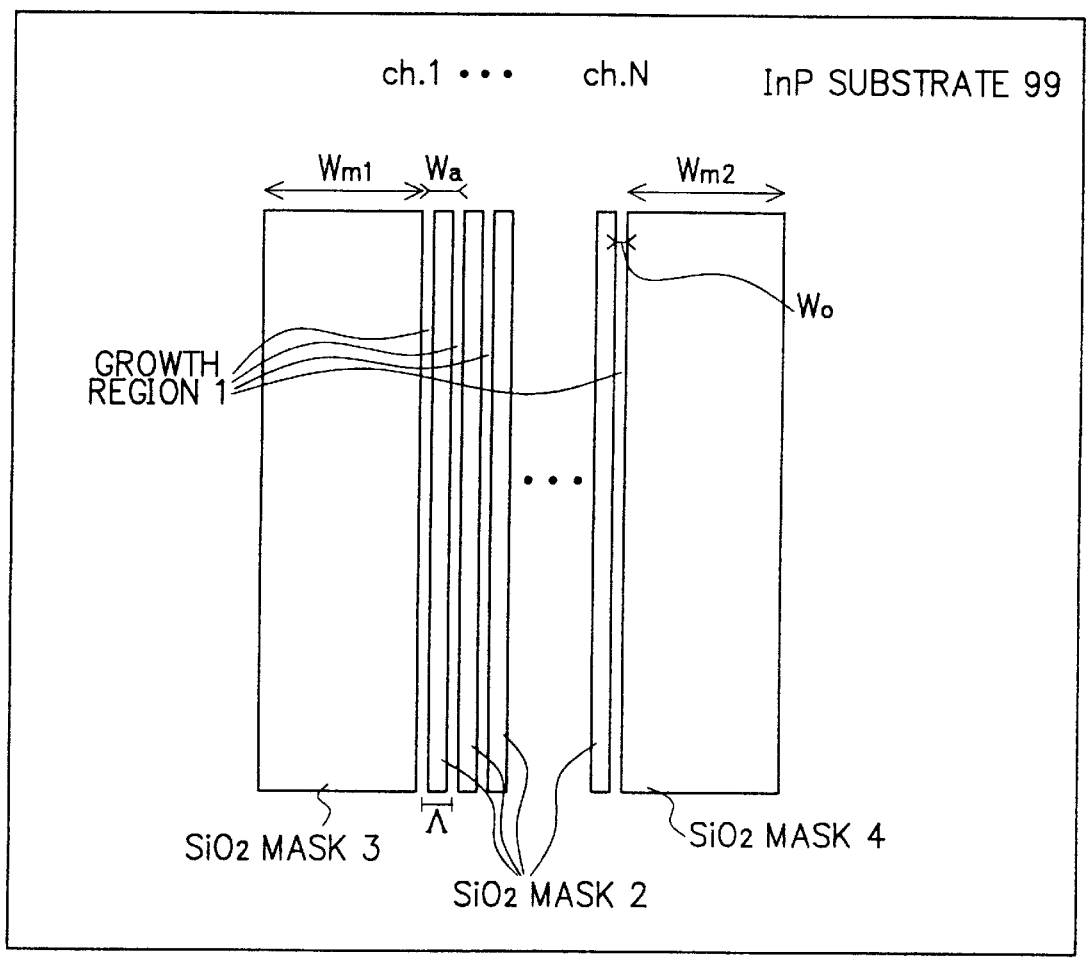
FIG. 1 is a schematic diagram showing $SiO_2$ growth prevention mask pattern employed in a selective growth in accordance with the present invention.

In the method of manufacturing a semiconductor optical waveguide array, an $SiO_2$ film is employed as a selective growth mask, the film having a size in a layout shown in FIG. 1. Shown in this diagram is an $SiO_2$ growth prevention mask pattern.

The $SiO_2$ mask is used for a selective growth and is formed on an InP substrate 99. The mask includes an $SiO_2$ mask 2 having a width of Wa, an $SiO_2$ mask 3 having a width $W_{m1}$, and an $SiO_2$ mask 4 having a width $W_{m2}$ to enclose a plurality of stripe-shaped growth regions 1. Each region has a width $W_0$, which is set to 1.5 μm.

The selective growth method of the present invention in which crystal is selectively grown in the array-shaped growth region with the mask pattern shown in FIG. 1 will be briefly called "narrow micro-array selective growth" for simplicity hereinafter. In the selective growth, a crystalline layer such as a multi-quantum well (MQW) is selectively grown in selective growth regions 1 each having a narrow width of 1.5 μm. The regions 1 are arranged with a particular array interval therebetween which is less than a diffusion length of seed material at crystal growth.

The band gap wavelength of the crystal grown in each growth region 1 can be basically controlled by changing widths $W_{m1}$ and $W_{m2}$ of the $SiO_2$ masks 3 and 4 disposed at the outer-most positions. However, the width Wa of the $SiO_2$ mask 2 is also a parameter exercises a certain influence on the composition and layer thickness of crystal grown in the growth region 1, which will be described later.

EXPERIMENTAL EXAMPLE 1

Figure 2:
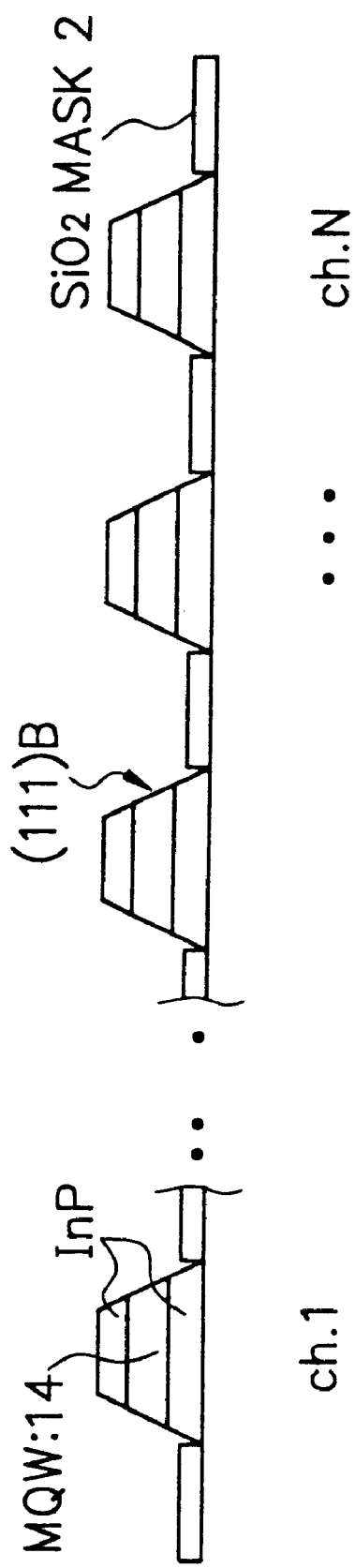
FIG. 2 is a diagram showing cross sectional view of a laminated configuration of respective channels.

In this Example 1, there are disposed eight array-shaped growth regions 1 (8 channels) each having a narrow stripe width of 1.5 μm and an array interval Λ of 11.5 μm. As shown in FIG. 2, an MQW layer is fabricated by selectively growing a multi-layer structure including a 1.50 μm InGaAsP well layer with compressive strain and a 1.20 μm InGaAsP barrier by metallo-organic vapor phase epitaxy (MOVPE). In this connection, FIG. 2 shows a laminated configuration of each channel.

Figure 3:
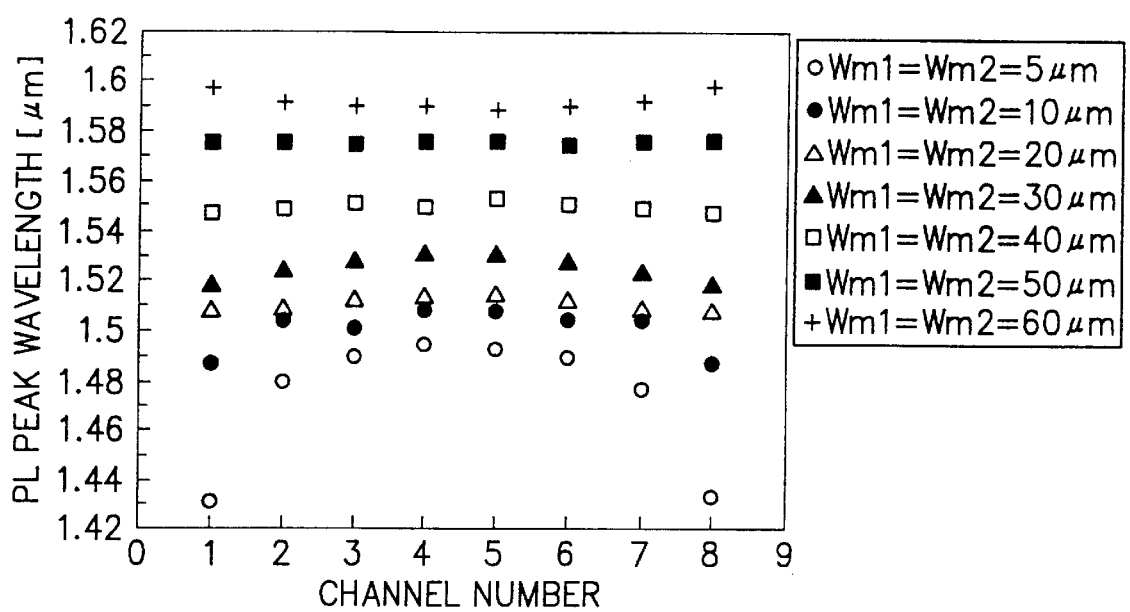
FIG. 3 is a graph showing dependence of photoluminescence (PL) peak wavelength of an MQW layer upon width of $SiO_2$ mask of Experimental Example 1.

The layers growth condition is of 150 Torr and 650° C. Widths of $SiO_2$ masks 2 to 4 are Wa=10 μm and $W_{m1}=W_{m2}=W_m$. By changing the value of $W_m$ from 5 μm to 60 μm, dependence of a peak wavelength of photoluminescence (PL) of the MQW layer upon the width Wm of $SiO_2$ mask was investigated. FIG. 3 shows results of the investigation. In this graph of the relationship above, the abscissa and the ordinate respectively indicate a channel number and a peak wavelength of photoluminescence of the MQW layer.

As can be seen from FIG. 3, for $W_{m1}=W_{m2}$, the wavelength distribution in the array is substantially symmetric for channels 1 to 8 centered on channel 4 or 5. The central value of the inter-channel distribution of PL peak wavelengths can be varied from a short wavelength to a long wavelength, i.e., in a range of 100 nanometers (nm) or more by enlarging the $SiO_2$ mask width Wm. However, to attain an almost uniform PL peak wavelength distribution over all channels, it is required to set the mask width Wm to a value equal to or slightly wider than Wa.

Dependence of the thickness of the waveguide layer on the mask width Wm was next examined. Results of the examination are shown in FIG. 4 in which the abscissa and the ordinate respectively designate the channel number and the thickness of the waveguide layer.

Figure 4:
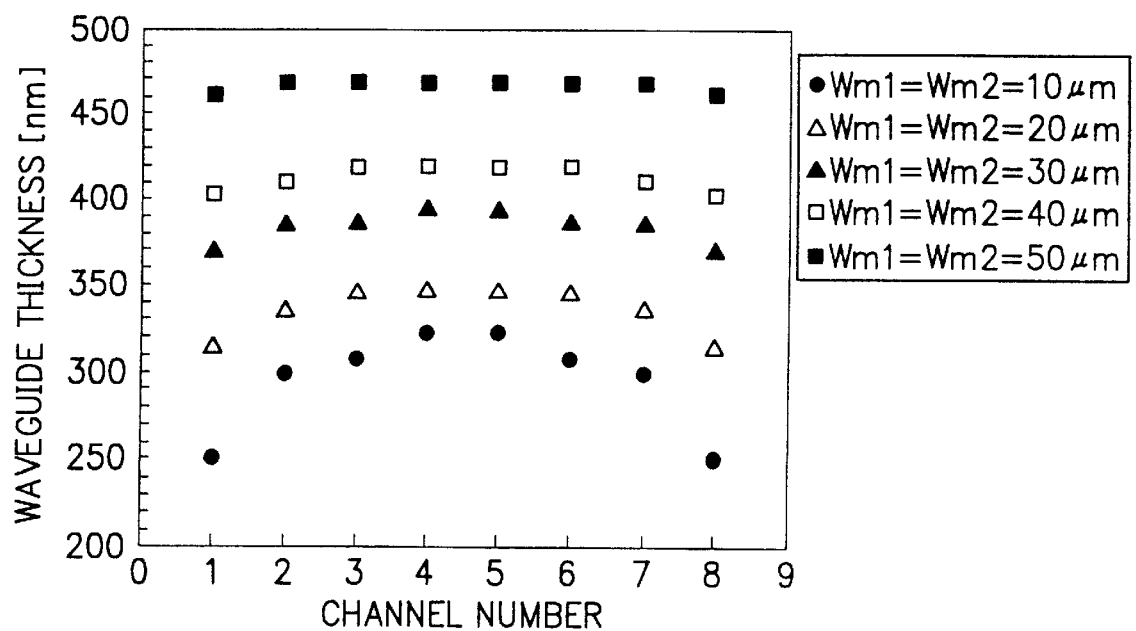
FIG. 4 is a graph showing dependence of optical waveguide layer thickness upon mask width Wm of Experimental Example 1.

As shown in FIG. 4, the waveguide layer thickness increases in association with increase of the $SiO_2$ mask width Wm. The layer thickness distribution is of almost the same shape as that of the PL peak wavelength shown in FIG. 3. It is therefore proved that the waveguide layer thickness can also be controlled by changing the $SiO_2$ mask width Wm.

EXPERIMENTAL EXAMPLE 2

In this Example 2, asymmetric masks are adopted, i.e., $W_{m1} \neq W_{m2}$ to check channel dependence of the PL peak wavelength. Results are shown in the graph of FIG. 5 in which the abscissa and the ordinate respectively designate the channel number and the PL peak wavelength.

Figure 5:
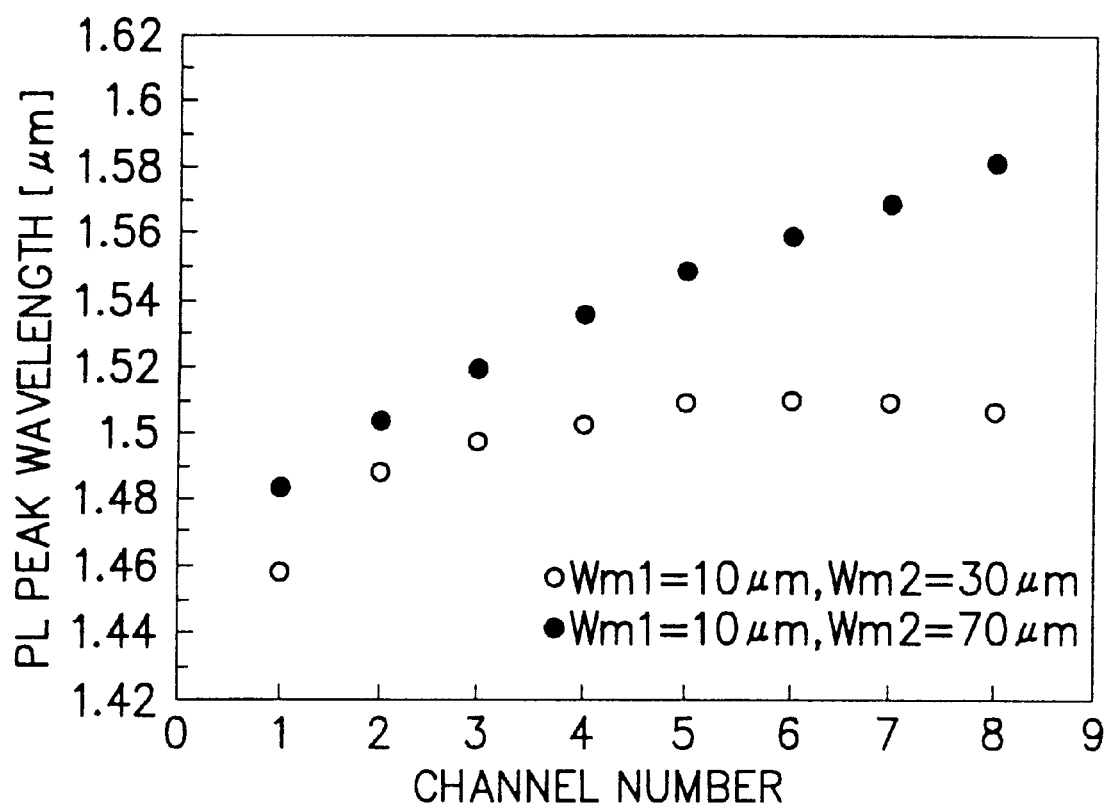
FIG. 5 is a graph showing channel dependence of PL peak wavelengths of Experimental Example 2.
Figure 6:
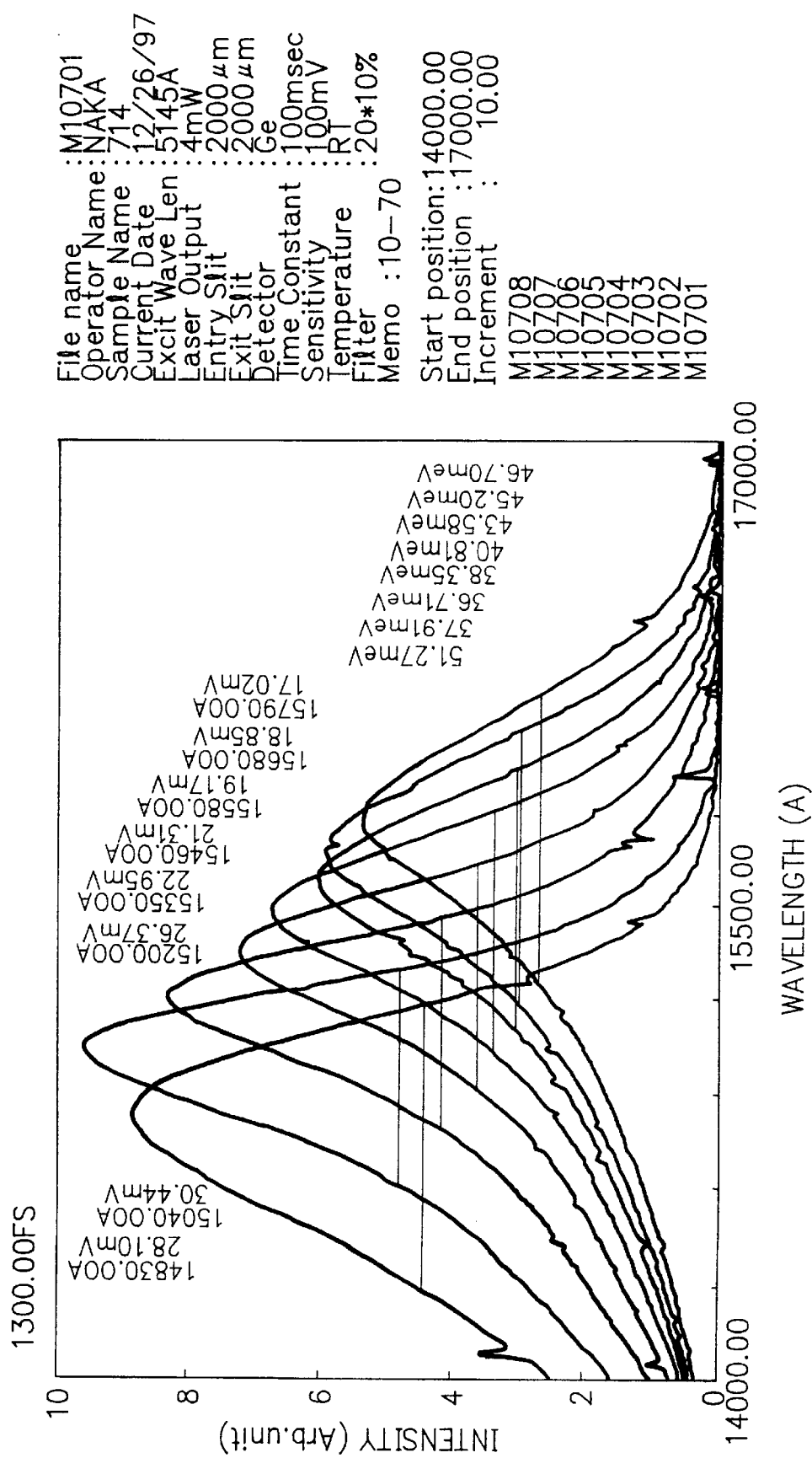
FIG. 6 is a graph showing PL spectral of Experiment Example 2.

As can be seen from FIG. 5, for masks of $W_{m1}=10$ μm and $W_{m2}=70$ μm, the PL peak wavelength can be changed for channels 1 to 8 of the array almost linearly in a 100 nm wavelength range from 1480 nm to 1580 nm. FIG. 6 shows photoluminescence (PL) spectral obtained with the masks of $W_{m1}=10$ μm and $W_{m2}=70$ μm. The PL intensity is kept at a high level in all channels, and the PL half-width is satisfactory narrow value. In FIG. 6, the abscissa and the ordinate respectively indicate the wavelength and the photoluminescence intensity.

On the other hand, for a combination of mask widths of $W_{m1}=10$ μm and $W_{m2}=30$ μm, the variation rate of the PL peak wavelength can be smoothed for channels 1 to 8 as shown in FIG. 5.

The results above imply that in the narrow-width microarray selective growth, when the combination of $SiO_2$ mask widths of $W_{m1}$ and $W_{m2}$ is appropriately selected, it is possible to arbitrarily control the band gap wavelengths of the respective MQW optowaveguides in the semiconductor optical waveguide array.

It is therefore confirmed that the narrow-width microarray selective growth technology of the present invention can be quite efficiently applied to the control of the band gap wavelength and the layer thickness of the micro-interval array device.

EXPERIMENTAL EXAMPLE 3

Figure 7:
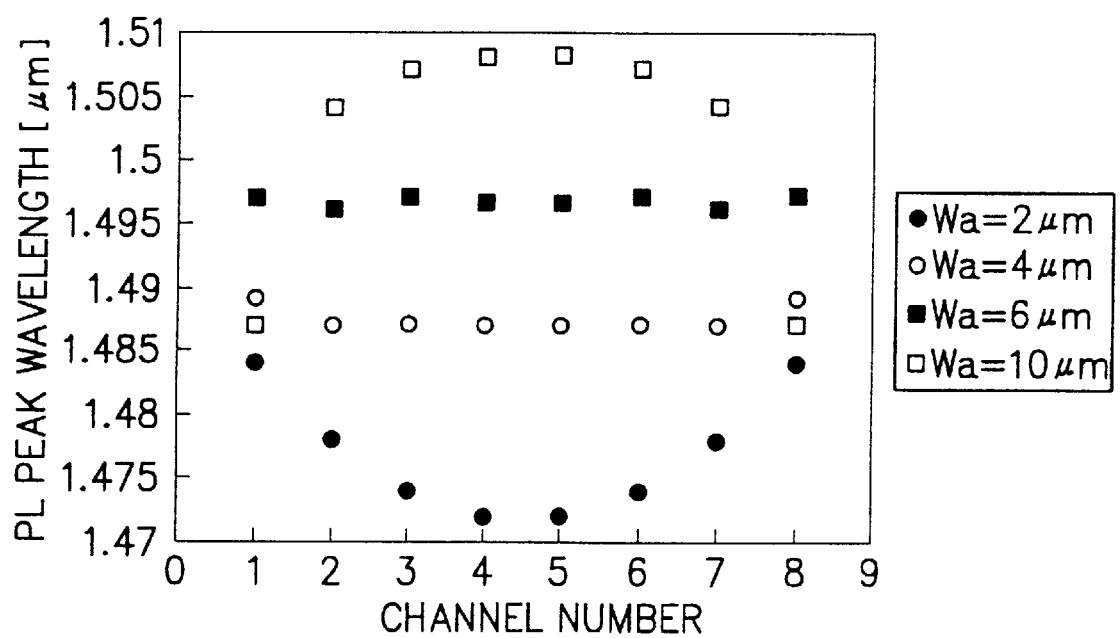
FIG. 7 is a graph showing channel dependence of PL peak wavelengths of MQW layer of Experimental Example 3.

In the final example, Experimental Example 3 was conducted to investigate influence of the width Wa of $SiO_2$ mask 2 arranged between the plural stripe-shaped growth regions on the crystal composition of the crystal selectively grown. FIG. 7 shows the results of the experiments in a graph.

In this example, experiments were conducted under conditions of $W_{m1}+W_{m1}+(7 \times Wa)=90$ μm (fixed) and $W_{m1}=W_{m2}=W_m$. That is, the value resultant from integration of the mask area is fixed in the experiments. FIG. 7 shows dependence of the photoluminescence peak value of the MQW layer on each channel when Wa is changed as 2, 4, 6, 8, and 10 μm (array interval Λ is correspondingly altered as 3.5, 5.5, 7.5, 9.5, and 11.5 μm).

For Wa=2 μm (1/19 of Wm width), the inter-channel wavelength distribution is downwards convex; for Wa=4 μm (about 1/8 of Wm width), the inter-channel wavelength distribution is substantially uniform; and for Wa=10 μm (equal to Wm width), the inter-channel wavelength distribution is upwards convex. The results support those obtained in the experiments shown in FIG. 3, namely, the mask width Wm is required to be equal to or slightly wider than Wa.

Moreover, there has been attained a new fact that the inter-channel uniformity of the PL peak wavelength distribution is deteriorated also in a case of Wm≫Wa.

In accordance with the results described above, it has been confirmed that Wa is also a parameter which also exerts a certain influence on the wavelength control of band gap in the MQW layer in the array.

Finally, although using no drawings for description in this section, the description will be given of the degree of freedom of the band gap wavelength control for a crystal grown. Namely, in the narrow-width micro-array selective growth, the degree of freedom can be increased by appropriately changing the width $W_0$ of the array-shaped growth region (see FIG. 1) in a direction of the waveguide.

For example, in a region of a small value of $W_0$, the thickness of the crystal grown is increased, so its composition is shifted toward the long wavelength.

In accordance with the results from the experimental examples 1–3, it can be considered that the narrow-width micro-array selective growth of the present invention is carried out primarily through two physical phenomena, i.e., 1) effect of diffusion of source material and 2) effect of migration of source material.

The effect of 1) can be efficiently used by setting the array interval of the micro-array to be fully less than the diffusion length of the material source. For example, the array interval is setting to not more than 50 μm. It is therefore possible to uniformly control the crystal composition and the layer thickness for all channels of the array.

On the other hand, the effect of 2) can be efficiently utilized by setting the width of the micro-array growth region to be fully less than the migration length of the source material, for example, the width is 10 μm or less such as 1.5 μm. As a result, the flatness of the layer of crystal selectively grown is improved. Moreover, the band gap wavelength of each channel as shown in FIG. 4 can be independently controlled.

Additionally, in accordance with the narrow-width micro-array selective growth of the present invention, by selectively setting the growth region width $W_0$ to about 1.5 μm, the array waveguide formed by the crystal selectively grown satisfies the single transverse mode condition without changing the size thereof. Consequently, 1) the micro-array waveguide can be fabricated without etching the semiconductor and hence the yield is remarkably improved. Moreover, 2) a side surface of the crystal selectively grown is a smooth (111)B plane as shown in FIG. 2 and hence there is obtained an advantage that the light signal loss is conspicuously lowered when compared with the conventional waveguide which are fabricated by etching and which has consequently a rough surface.

The results of these experiments above indicate that the narrow-width micro-array selective growth technology of the present invention makes it possible to manufacture an array light source in a very high integration density in a region in which one light source is conventionally fabricated at an interval of 250 μm. The array light source includes a plurality of optical waveguides which are mutually different in crystal composition appropriately controlled.

In a concrete example, even a different wavelength 8-channel array light source with a cavity length of 300 μm can be manufacture in the size of the one chip (250 μm×300 μm) of the conventional technology. This means that "the array-structured semiconductor optical devices" can be fabricated on one wafer, the number of the devices being equal to the number of chips of the conventional single optical devices.

In short, the integration density becomes ten times or more that of the conventional integrated optical device. The present invention is therefore a quite effective technology to practically implement an array-structured semiconductor optical device in ultra-high integration.

Referring now to the accompanying drawings, description will be specifically given in detail of embodiments in accordance with the present invention.

DESCRIPTION OF PREFERRED EMBODIMENTS

Description will be given of embodiments of a method of manufacturing a semiconductor optical waveguide array and an array-structured semiconductor optical device in accordance with the present invention.

In the present invention, when a semiconductor optical waveguide array is fabricated through a crystal growing process in which a crystal is selectively grown by MOVPE method with dielectric masks, between two adjacent waveguide of plural waveguides fabricated parallel to each other with an interval therebetween, the interval being shorter than the diffusion length of a source material in a reaction tube, the band gap energy and the layer thickness of the crystal grown are controlled, using a dielectric thin film of width Wa formed between crystal growth regions, and two outer-most dielectric thin films formed at outer-most sides with widths $W_{m1}$ and $W_{m2}$ ($W_{m1}$, $W_{m2}$>Wa), respectively.

Subsequently, description will be given in detail of embodiments of the present invention by referring to the drawings.

Embodiment 1

Figure 8:
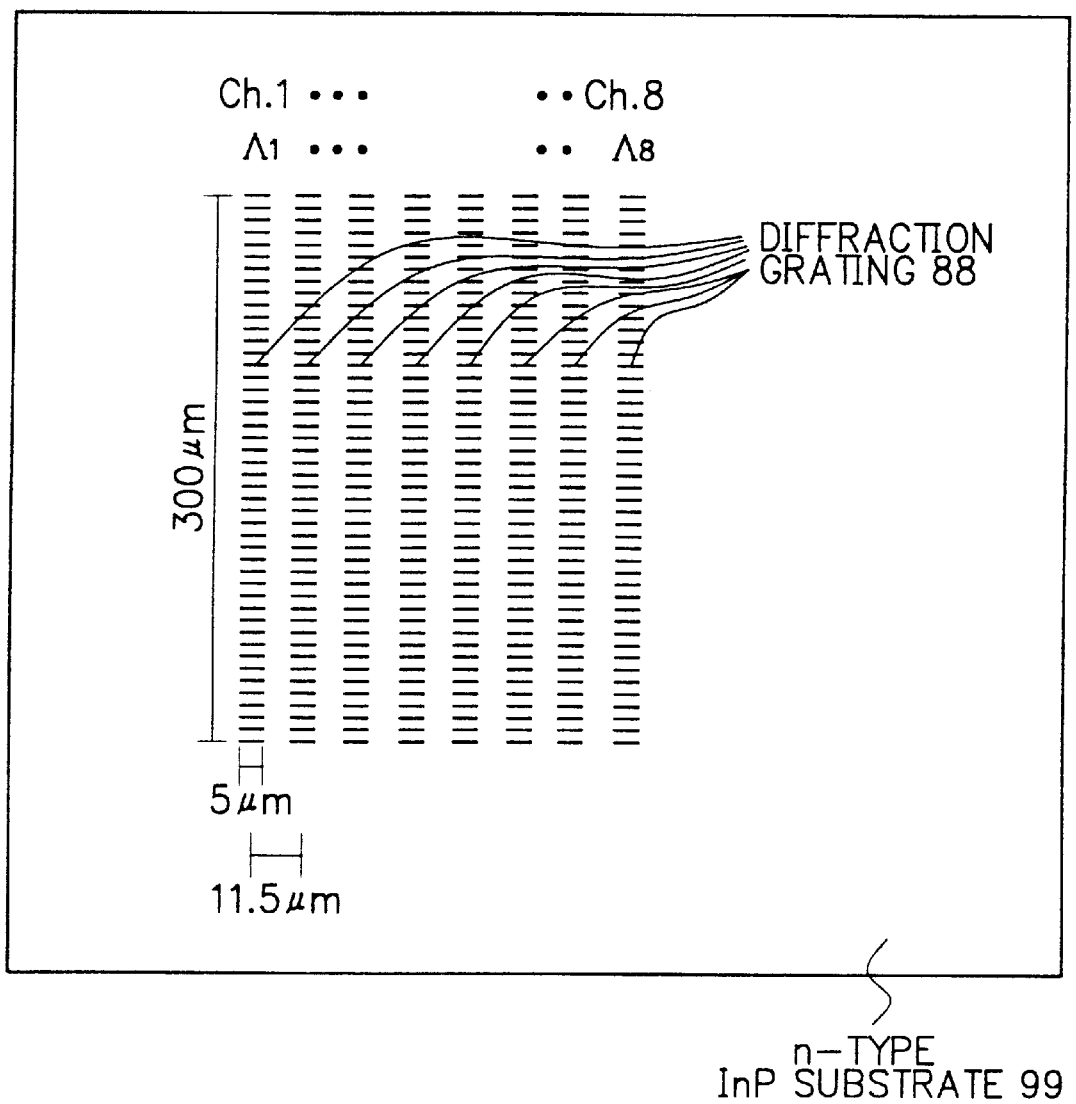
FIG. 8 is a diagram illustratively showing a layout of a first embodiment of diffraction grating structure of the present invention.

In this embodiment, an array-structured semiconductor optical device of the present invention is applied to a micro-array distribution feedback (DFB) type of semiconductor laser. FIG. 8 shows a layout of diffraction gratings, FIG. 9 is a plan view of masks, and FIG. 10 shows cross-sectional views for explaining a semiconductor laser layer structure of each channel of an array.

The DFB type semiconductor laser 100 (to be simply called "semiconductor laser" hereinafter) of this embodiment is that of a semiconductor laser of this type in which the detuning, ie. the difference between the gain peak wavelength of the laser and the Bragg wavelength of the diffraction grating, is adjusted to an appropriate value of ±10 nm.

Figure 10:
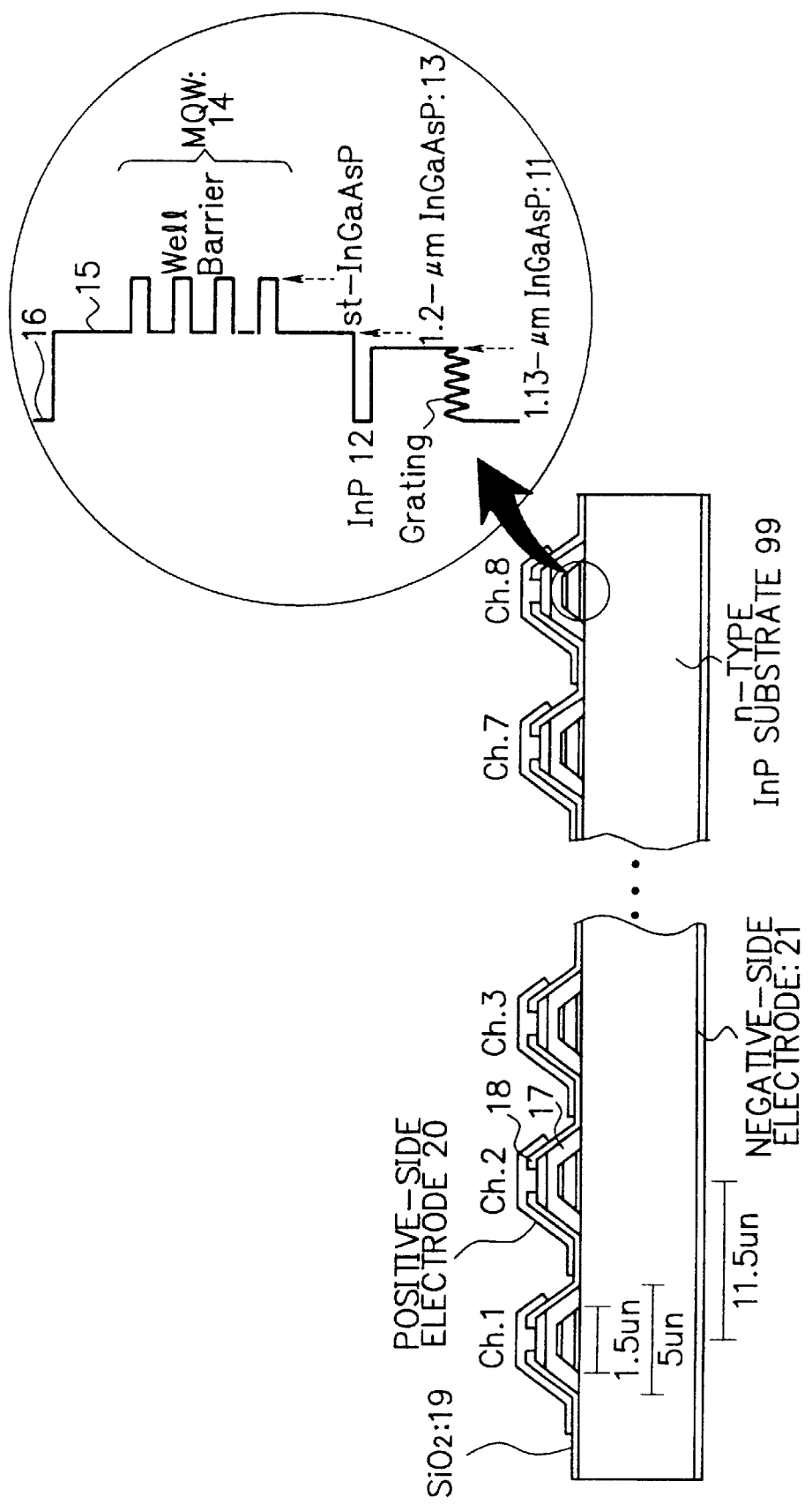
FIG. 10 is a cross sectional view of a laminated structure of a semiconductor laser of the embodiment 1.

As shown in FIG. 10, the semiconductor laser 100 has a laminated structure comprising, on an n-type InP substrate 99, a 1.13 μm n-type InGaAsP semiconductor layer 11, an n-type InP spacer layer 12, a 1.20 μm n-type InGaAsP light confining layer 13, a 7-film multi-quantum well layer 14 (1.50 μm InGaAsP well with compressive strain/1.20 μm InGaAsP barrier), a 1.20 μm InGaAsP light confining layer 15, and a p-type InP layer 16. The semiconductor laser 100 further includes on the laminated structure a p-type InP embedded clad layer 17 with a layer thickness of 2.0 μm, a 0.3 μm thick p⁺-type InGaAs contact layer 18, an $SiO_2$ protective layer 19, a Cr/Au upper electrode 20 on an upper location, and a Cr/Au lower electrode 21 on a rear location.

Method of fabricating semiconductor laser 100

A method of manufacturing the laser 100 will be next described by referring now FIGS. 8 and 9.

First, as can be seen from FIG. 8, a diffraction grating pattern 88 is drawn by electron beam exposure and the like in a region on the n-type InP substrate 99 in a transversal direction for eight channels with an interval of 11.5 μm therebetween, each channel being 5 μm wide and 300 μm long.

To change the oscillation wavelengths of the respective channels from 1536 nm to 1568 nm with setting an oscillation frequency discrepancy of 4 nm between the adjacent channels, the period Λ1 of the diffraction grating of channel 1 is set to 240 nm and the period is incrementally assigned to the other gratings with an increment of 0.625 nm, namely, the period Λ8 of the diffraction grating of channel 1 is accordingly set to 245 nm in the process above. The diffraction grating pattern 88 is then copied onto the n-type InP substrate 99 by ordinary wet etching to fabricate a 60 nm deep diffraction grating 88.

On the substrate 99 with the grating 88 therein, an $SiO_2$ masks 2 to 4 are then formed in a direction of <011> for selective growth as shown in FIG. 9.

In the process, the masks 2 to 4 are fabricated under a condition of Wa=10 μm, $W_{m1}$=20 μm, and $W_{m2}$=50 μm to enclose eight growth regions (i.e., regions for the diffraction grating 88 and each growth region has a width $W_0$ of 1.5 μm), the masks 2 to 4 opposing to each other.

On the other hand, to establish a window structure in both edge surfaces of a resonator, a 25 μm wide $SiO_2$ mask 5 is formed on both edge surfaces of the resonator.

On the substrate with these masks 2 to 5, a 1.13 μm n-type InGaAsP semiconductor layer 11, an n-type InP spacer layer 12, a 1.20 μm n-type InGaAsP light confining layer 13 with, a 7-film multi-quantum well (MQW) layer 14 (1.50 μm InGaAsP well with compressive strain/1.20 μm InGaAsP barrier), a 1.20 μm InGaAsP light confining layer 15, and p-type InP layer 16 are fabricated by MOVPE or the like in accordance with the composition of each semiconductor layer in the layer direction shown in the cross-sectional views of FIG. 10. The layers are grown under a pressure of 150 Torr at a temperature of 650°.

As a result, the photoluminescence (PL) peak wavelength of the MQW layer 14 can be changed from 1535 nm to 1570 nm for channels 1 to 8. Consequently, the gain peak wavelength of the MQW layer 14 can be changed to follow the oscillation wavelength of each channel determined by the period Λ of the diffraction grating. Namely, the detuning quantity, i.e., the discrepancy between the oscillation wavelength and the gain peak wavelength can be favorably retained within an appropriate value range of ±10 nm.

After the semiconductor layers are fabricated in this manner, a growth preventing mask is again formed to change the mask opening $W_0$ from 1.5 μm to 5 μm in the overall region. Using the mask, a 2.0 μm thick p-type InP embedded clad layer 17 and a 0.3 μm thick p$^+$-type InGaAs contact layer 18 are selectively grown by MOVPE. Thereafter, an SiO$_2$ layer is fabricated on the overall surface to form current injection windows and a Cr/Au upper electrode 20 and a Cr/Au lower electrode 21 are manufactured by ordinary sputtering or the like.

Finally, to dispose a 25 μm window structure in both edge surfaces of the resonator, a device portion having a resonator length of 350 μm is cleaved and then a low-reflection coating SiON film is applied on both edge surfaces thereof by ordinary sputtering to complete the device.

As described-above, although the size of the overall chip size is quite small, i.e., about 100 μm×350 μm, there is manufactured a different wavelength DFB laser array in which each DFB laser of the array is independently detuned.

To be controlled appropriate detuning quantities of the respective channels, there can be obtained appropriate and uniform characteristics for each channel: single-side light output power 18 mW±1 mW@150 mA at 25° C. and continuous-wave (CW) threshold current=10 mA±1 mA.

Embodiment 2

Figure 11:
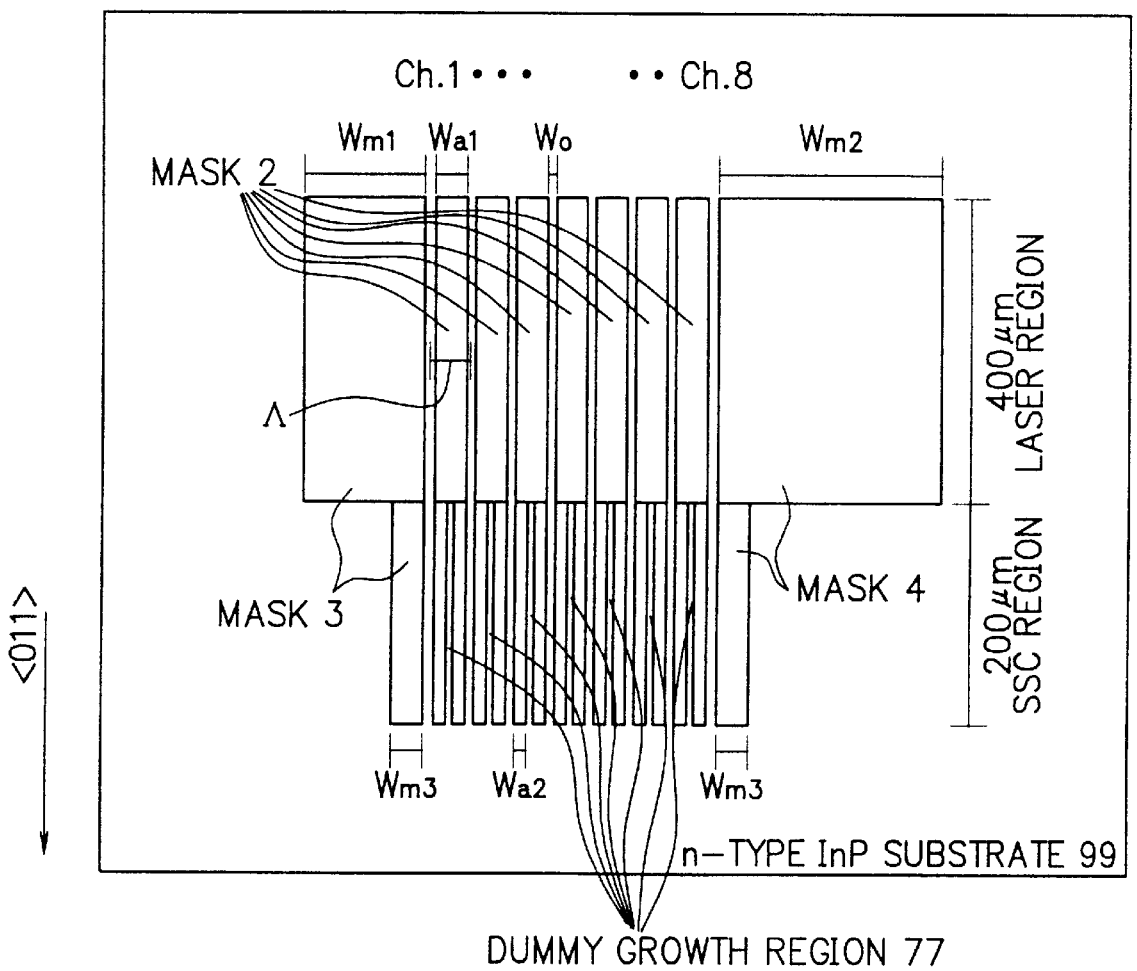
FIG. 11 is a plan view of a mask associated with the second embodiment.

In the embodiment 2, an array-structured semiconductor optical device of the present invention is applied to a micro-array different wavelength semiconductor laser. FIG. 11 shows masks of the embodiment, FIG. 12 shows composition of each semiconductor layer of a laminated structure of the embodiment, and FIG. 13 shows in a partial perspective cross sectional view a configuration of the semiconductor laser.

Figure 12:
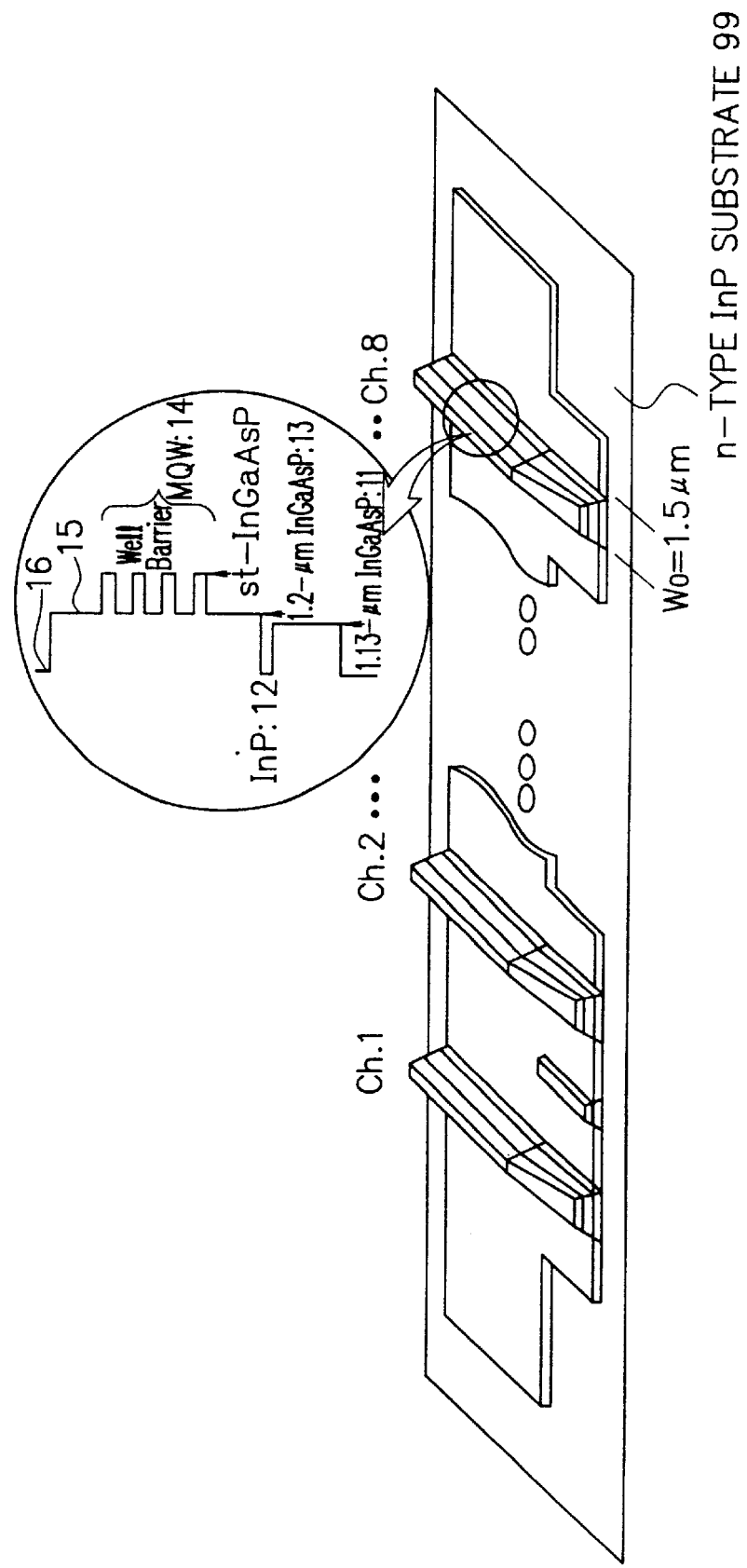
FIG. 12 is a diagram showing a mask used in the second embodiment.
Figure 13:
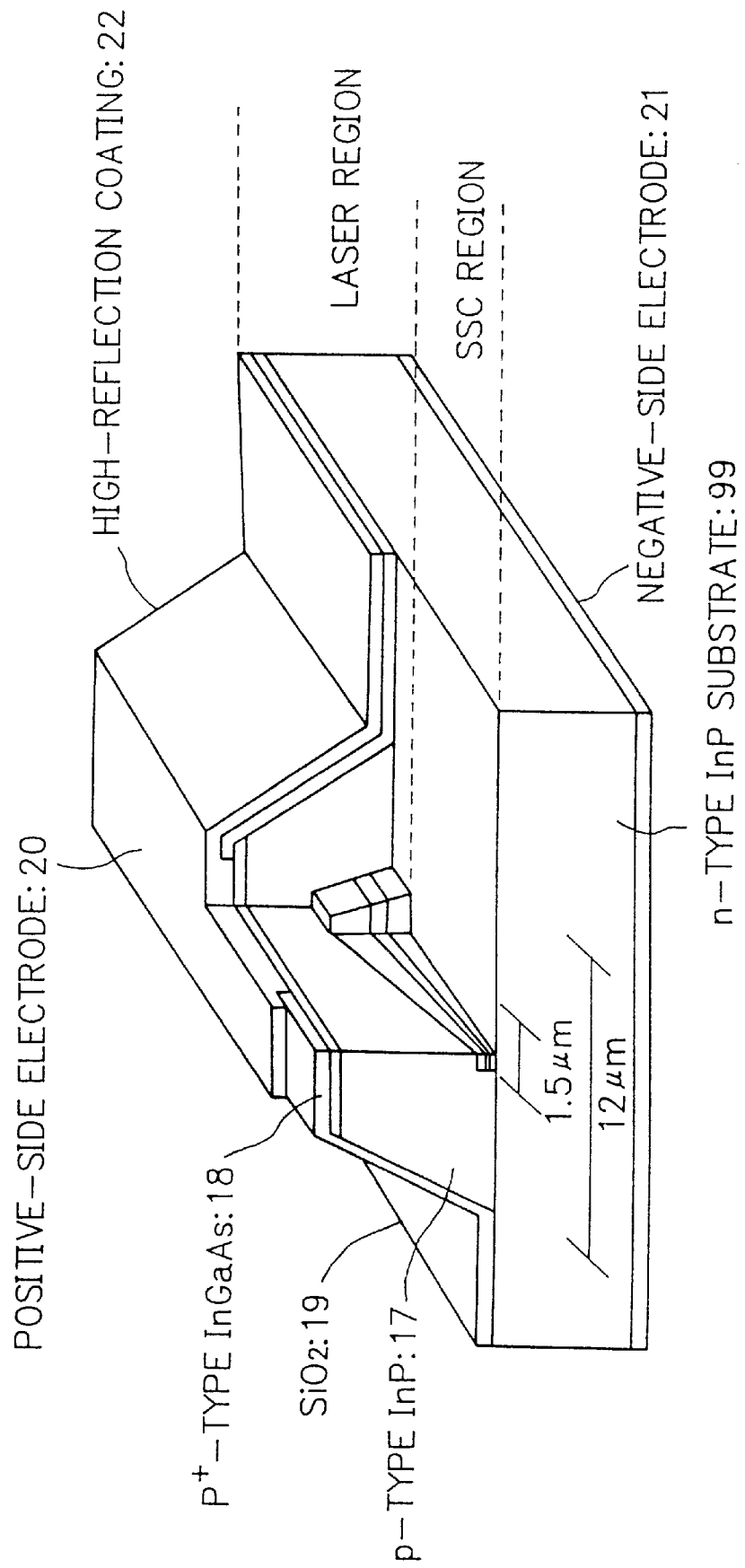
FIG. 13 is a partial perspective view showing a configuration of a semiconductor laser of the second embodiment.

The semiconductor laser 200 of this embodiment is a micro-array different wavelength semiconductor laser including a spot size converter (SSC) in which each channel includes a laminated structure of layer composition shown in FIG. 12. The laser 200 has an overall construction shown in FIG. 13. For each channel, the semiconductor laser device is of the same configuration as the device of the embodiment 1 excepting that the p-type InP embedded clad layer 17 has a layer thickness of 5.0 μm.

Method of fabricating semiconductor laser 200

First, SiO$_2$ masks 2 to 4 are formed on an n-type InP substrate 99 in a direction of <011> for selective growth by a stepper or the like as shown in FIG. 11. The masks 2 to 4 enclose eight array-like growth regions with an array interval of 20 μm, each growth region having an opening width $W_0$ of 1.5 μm. In a 400 μm long laser region, the masks 2 to 4 have widths $W_{a1}$=18.5 μm, $W_{m1}$=30 μm, and $W_{m2}$=4 μm, respectively. In a 200 μm long SCS region, the mask 2 has a width $W_{a2}$=4 μm and the masks 3 and 4 have an equal width, i.e., $W_{m3}$=7 μm. However, in the SSC region, since the SiO$_2$ mask 2 has a width $W_{a2}$=4 μm, namely, is less than the array interval=20 μmm, a dummy growth region 77 is disposed between growth regions of the respective channel.

On the substrate with the masks, optical waveguide layer shown in FIG. 12 are selectively grown by MOVPE under a pressure of 70 Torr at a temperature of 650° C.

More specifically, the laminated configuration includes a 1.13 μm n-type InGaAsP semiconductor layer 11, an n-type InP spacer layer 12, a 1.20 μm n-type InGaAsP light confining layer 13, a 7-film multi-quantum well (MQW) layer 14 (1.50 μm n-type InGaAsP well with compressive strain/1.20 μm InGaAsP barrier), a 1.20 μm InGaAsP light confining layer 15, and a p-type InP layer 16.

As a result of the layer growth process, the overall layer thickness of the waveguide layer distributes through a range of from 0.25 μm to 0.35 μm for channels 1 to 8 in the laser region and from 0.08 μm to 0.1 μm for channels 1 to 8 in the SSC region. In the laser region, the photoluminescence peak wavelength of the MQW layer can be changed in a range of from 1540 nm to 1590 nm for channels 1 to 8.

After the semiconductor layers 11 to 16 are grown in this fashion, a growth prevention mask is again formed with the mask opening width $W_0$ changed from 1.5 μm to 12 μm in the overall region. Using the mask, a 5.0 μm thick p-type InP embedded clad layer 17 and a 0.3 μm thick p$^+$-type InGaAs contact layer 18 are grown by MOVPE. On the entire surface, an SiO$_2$ layer is then fabricated to form current injection windows and a Cr/Au upper electrode 20 and a Cr/Au lower electrode 21 are manufactured in a usual sputtering process or the like. Finally, all resonators each having a length of 600 μm are cleaved such that each resonator has a laser region length of 400 μm and an SSC region length of 200 μm. A high-reflection coating SiON film 22 is then fabricated on both edge surfaces of the laser by ordinary sputtering to thereby complete the device.

There is resultantly manufactured an 8-channel different wavelength semiconductor laser array including a spot size converter in quite a small overall chip size of 160 μm×600 μm.

In the laser, the oscillation wavelength can be distributed through a range of from 1540 nm to 1590 nm for the channels of the laser array. Additionally, the threshold current characteristic is quite favorable and uniform, i.e., 6 mA±1 mA and the single-side light output power is also satisfactorily obtained as 30 mW or more at a temperature of 25° C.

Using a flat-end optical fiber, a coupling loss of the laser array with the fiber was measured, which results in a quite acceptable value of 3 dB or less for all channels. It has been therefore also confirmed that the spot size converter fully functions for all constituent devices of the laser array.

Embodiment 3

Figure 14:
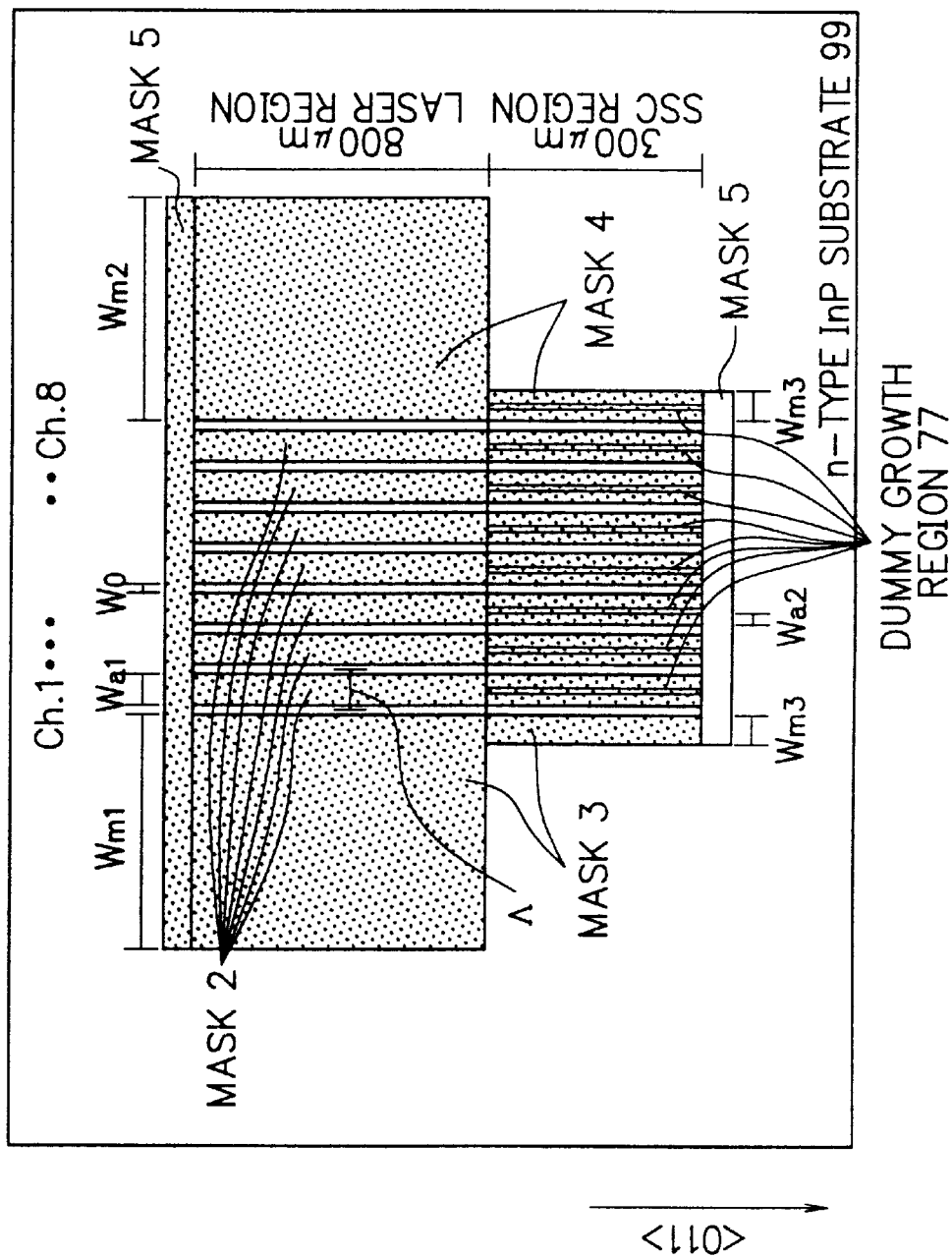
FIG. 14 is a plan view of a mask for a third embodiment of the present invention.
Figure 15:
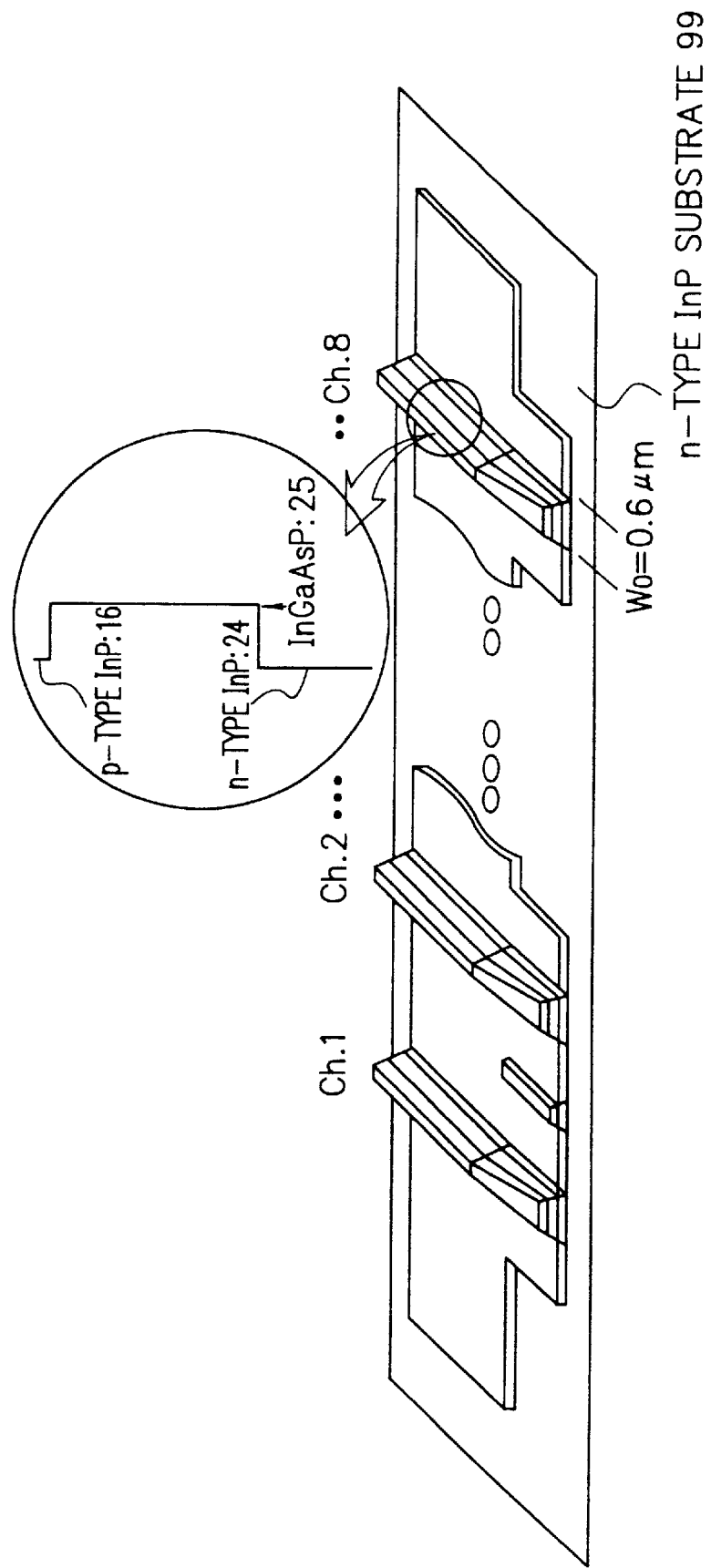
FIG. 15 is a diagram showing a mask used in the third embodiment.

In this embodiment, an array-structured semiconductor optical device of the present invention is applied to a micro-array semiconductor optical amplifier including a spot size converter. FIG. 14 shows in a plan view masks of the embodiment 3, FIG. 15 shows composition of each semiconductor layer in a laminated configuration of the array-structured semiconductor optical device, and FIG. 16 partly shows in a perspective cross sectional view the structure of the semiconductor laser.

Figure 16:
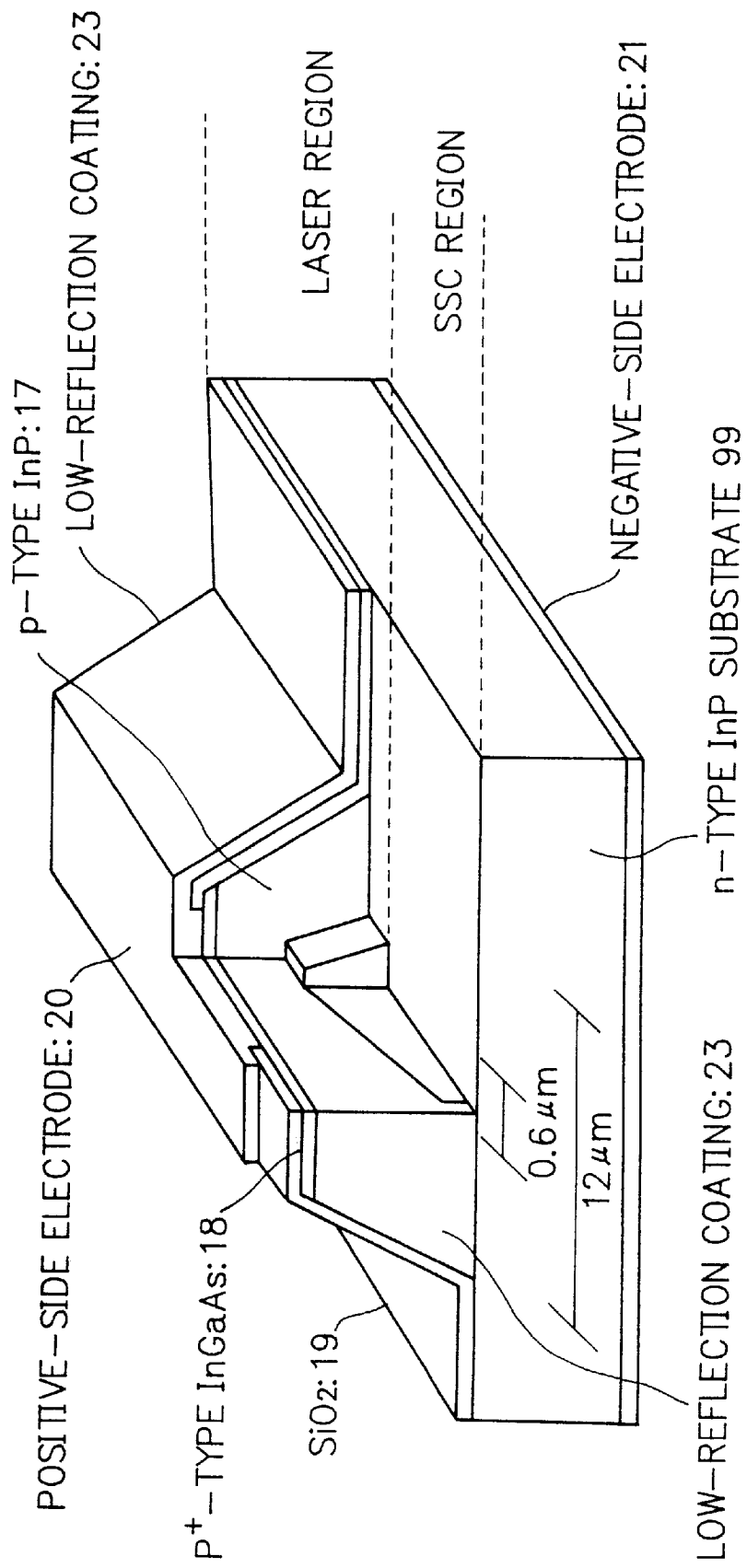
FIG. 16 is a perspective view partly showing a construction of a semiconductor laser of the third embodiment.

The optical amplifier 300 of the present embodiment is a micro-array semiconductor optical amplifier including a spot size converter. Each channel of the optical amplifier includes a laminated structure of composition shown in FIG. 15 and has an overall construction shown in FIG. 16. That is, as shown in FIGS. 15 and 16, the optical amplifier 300 includes an n-type InP substrate 99 on which a 0.2 µm thick n-type InP buffer layer 24, a 0.4 µm thick 1.50 µm InGaAsP bulk active layer 25 with compressive strain, and a p-type InP layer 16 are fabricated in a laminated structure. Formed thereon are a p-type InP embedded clad layer 17 having a layer thickness of 5.0 µm and a p$^+$-type InGaAs contact layer 18 with a layer thickness of 0.3 µm. The optical amplifier 300 further includes an SiO$_2$ protective layer 19 on the overall surface of the substrate, a Cr/Au upper electrode 20 on an upper surface thereof, and a Cr/Au lower electrode 21 on a lower surface thereof.

In the fabrication of the semiconductor device 200 described in the embodiment 2, the width $W_0$ of the SiO$_2$ mask growing region used for the narrow-width micro-array selective growth is set to 1.5 µm and a multi-quantum well layer is employed as the active layer. On the other hand, in the present embodiment 3, the growth region width $W_0$ is set to 0.6 µm, and an InGaAs bulk layer is used as the active layer.

As a result, a micro-array semiconductor optical amplifier including a spot side converter can be easily manufactured through processes which are almost the same as those used in the embodiment 2.

Method of fabricating optical amplifier 300

As can be seen from FIG. 14, SiO$_2$ masks 2 to 4 are fabricated on an n-type InP substrate 99 in a direction of <011> with an array interval of 20 µm.

The SiO$_2$ mask widths are selected as follows. In the SSC region having a region length of 300 µm, $W_{a2}$=1 µm and $W_{m3}$=4 µm; whereas, in the amplifier region with a region length of 800 µm, $W_{a1}$=18.5 µm, $W_{m1}$=80 µm, and $W_{m2}$=80 µm. In both regions, the masks are grown to enclose eight growth regions each having a growth region width $W_0$ of 0.6 µm, the masks opposing to each other. However, the width $W_{m2}$ of SiO$_2$ mask 2 is 1 µm in the SSC region, namely, is less than the array interval of 20 µm and hence a dummy growth region 77 is disposed between the growth regions of the respective channels. On the other hand, to fabricate the window structure on both edge surfaces of the resonator, a 25 µm wide SiO$_2$ mask 5 is arranged on both end surfaces of the resonator.

On the substrate with the masks thereon, a laminated structure is grown with composition of each layer as shown in FIG. 15. Specifically, a 0.2 µm thick n-type InP buffer layer 24, a 0.4 µm thick 1.50 µm InGaAsP bulk active layer 25 with compressive strain, and a p-type InP layer 16 are selectively grown by MOVPE or the like under a pressure of 300 Torr at a temperature of 650° C.

In accordance with the device, the photoluminescence peak wavelength of the bulk layer in the amplifier region can be kept almost retained in a range of from 1550 nm to 1570 nm for channels 1 to 8. Moreover, in the SSC region, the photoluminescence peak wavelength of the bulk layer is uniformly obtained in a range of from 1380 nm to 1390 nm for channels 1 to 8. Namely, the wavelength is sufficiently minimized for a low-loss passive waveguide having a spot size converter function. For all channels, the thickness of the InGaAsP bulk layer in the SSC region is advantageously reduced to at least ¼ that of the layer thickness of the InGaAsP bulk layer in the amplifier region.

After the growth of respective semiconductor layers, the SiO$_2$ masks 2 to 4 are again formed with the mask opening width $W_0$ changed from 0.6 µm to 12 µm in the overall region. Utilizing the masks, a 5.0 µm thick p-type InP embedded clad layer 17 and a 0.3 µm thick p$^+$-type InGaAs contact layer 18 are grown by MOVPE.

Thereafter, an SiO$_2$ layer 19 is fabricated on the entire surface to form current injection windows and a Cr/Au upper electrode 20 and a Cr/Au lower electrode 21 are manufactured in an ordinary sputtering process or the like. Finally, to manufacture a 25 µm length window structure on both edge surfaces, a resonator region having a length of 1150 µm is cleaved and then a low-reflection coating SiON film 23 is fabricated on both edge surfaces. There is resultantly produced an 8-channel array semiconductor optical amplifier including a spot size converter in quite a small size of 160 µm×1150 µm.

With the optical amplifier, there are obtained acceptable characteristics for all channels, i.e., an optical gain of 10 dB±0.2 dB for an incident light having a wavelength of 1560 nm with a current of 30 mA injected to the amplifier and a coupling loss with a flat end optical fiber of 3.5 dB dB±1 dB.

Since a bulk layer is adopted as the active layer and the width $W_0$ is set to 0.6 µm, the selectively grown waveguide has a lateral cross section having substantially a square contour and hence the gain characteristic of the amplifier is independent of polarization with respect to the transverse electric (TE) wave and the transverse magnetic (TM) wave.

Additionally, with the optical amplifier coupled to a quartz-based planar lightwave circuit (PLC) in a passive alignment mount, gate switching operations are investigated. It has been resultantly confirmed for all channels that a satisfactory switching operation of an extinction ratio of 50 dB or more is obtained for an incident light having a wavelength of 1560 nm.

Embodiment 4

Figure 17:
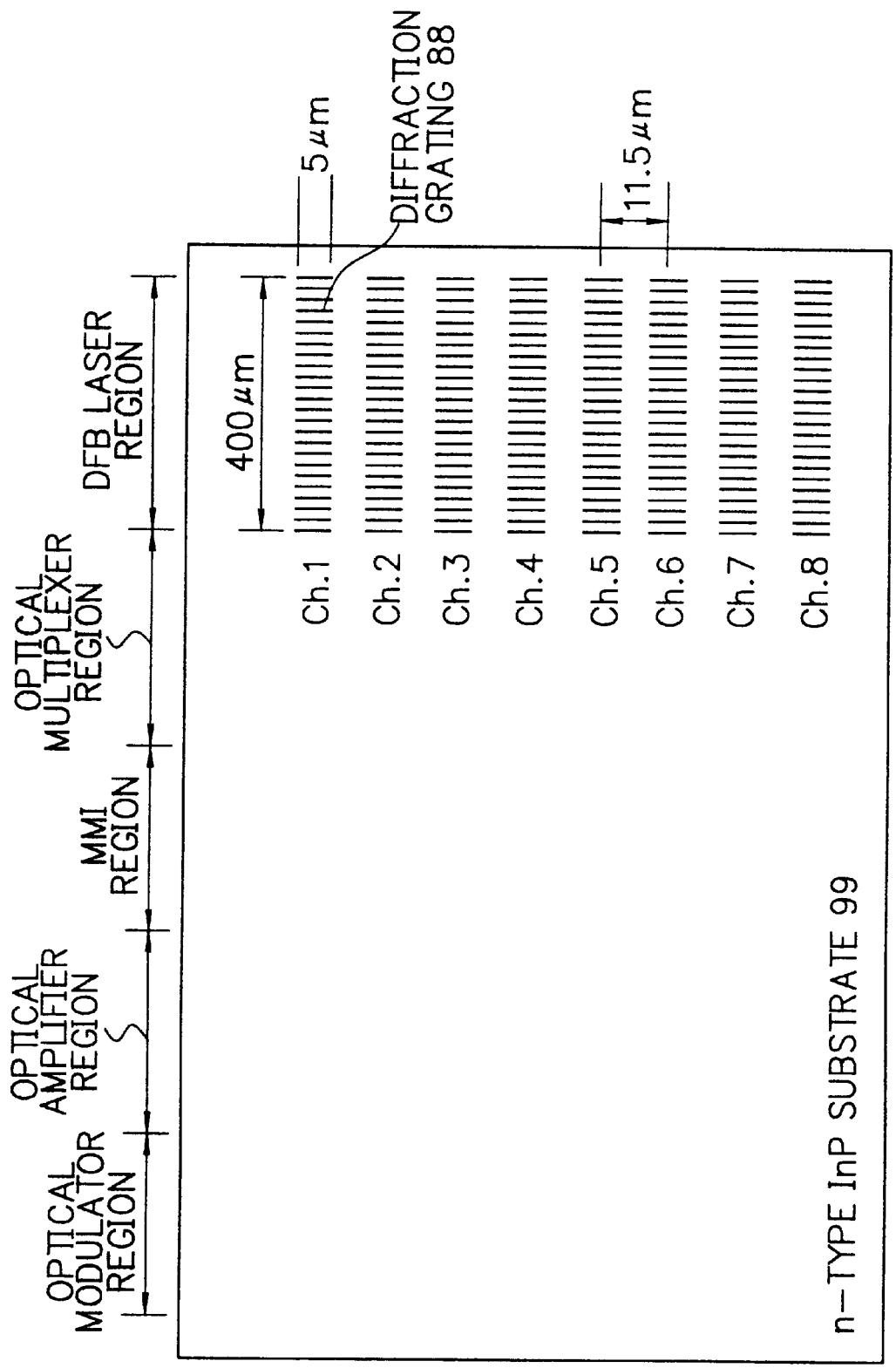
FIG. 17 is a diagram showing a layout of diffraction gratings of a fourth embodiment of the present invention.
Figure 18:
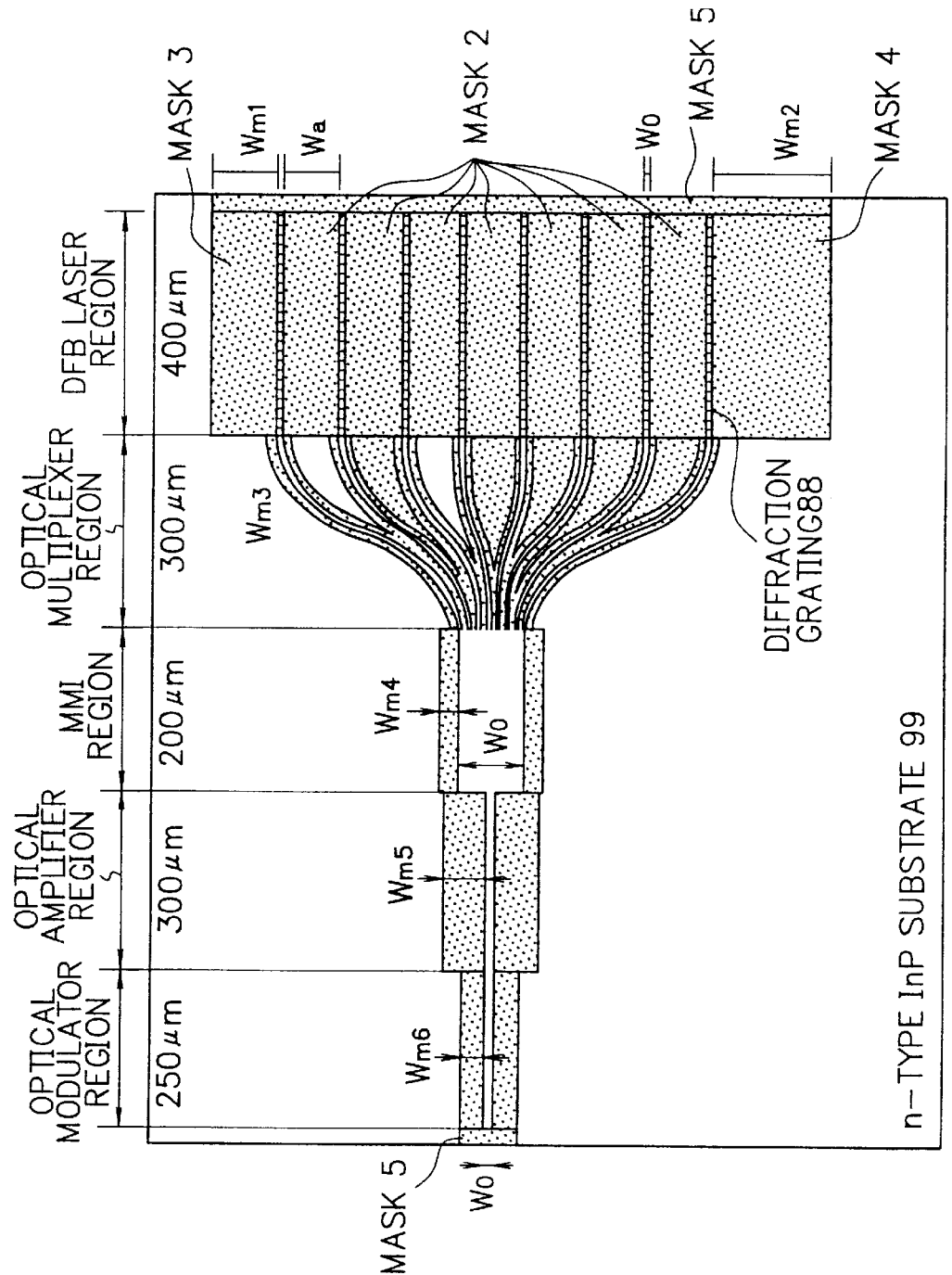
FIG. 18 is a plan view showing a mask of the fourth embodiment.

In this embodiment, an array-structured semiconductor optical device of the present invention is applied to a micro-array wavelength selective light source. FIG. 17 shows a layout of a diffraction grating, FIG. 18 is a plan view of masks of the embodiment 4, and FIG. 19 shows in a perspective view a configuration of the wavelength selective light source.

Figure 19:
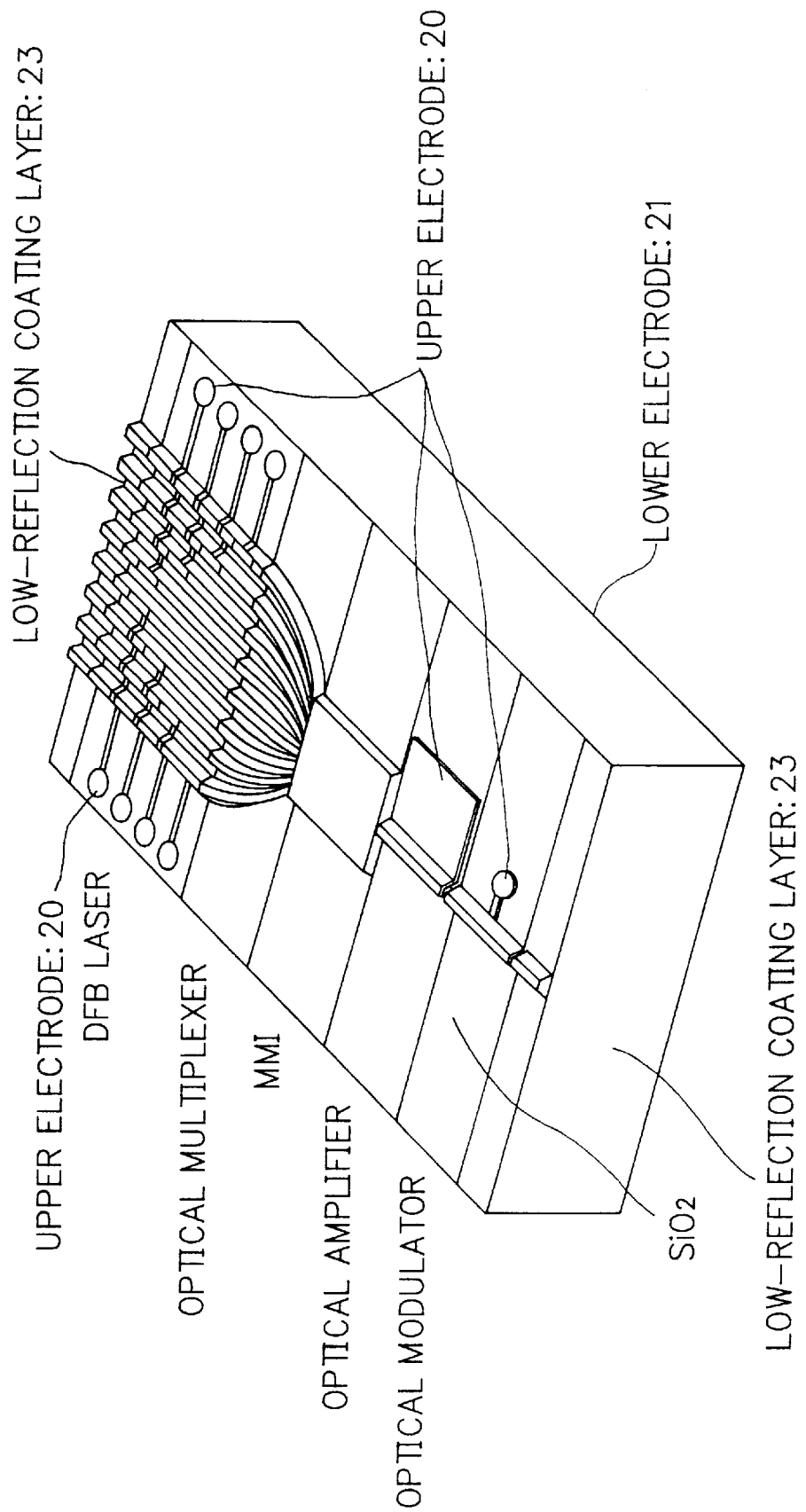
FIG. 19 is a perspective view showing structure of a wavelength selection light source of the fourth embodiment.

The optical amplifier 400 of the present embodiment is an ultra-small-sized wavelength selective light source in the form of a monolithic integrated circuit on an InP substrate and primarily includes five regions as shown in FIG. 19. In short, the light source 400 includes 1) a DFB laser region, 2) an optical multiplexer region, 3) a multimode interference region, 4) an optical amplifier region, and 5) an optical modulator region.

Method of fabricating wavelength selective light source 400

As can be seen from FIG. 17, a diffraction grating pattern 88 is drawn only in the DFB laser region on an n-type InP substrate 99 by an electron beam exposing process. Specifically, a 5 µm wide, 400 µm long line is drawn for each array in a lateral direction for each of the eight channels with an interval of 11.5 µm therebetween.

In the process, to change the oscillation wavelength of the respective channels in the laser region in a range of from 1536 nm to 1547.2 nm (i.e., with an increment of 1.4 nm for each channel), the diffraction grating of channel 1 has a period Λ1 of 240 nm, and the period is incremented by 0.25 nm for each of the gratings of the other channels. As a result, the grating of channel 8 has a period Λ 8 of 241.75 nm.

The grating pattern 88 is copied onto the n-type InP substrate 99 by ordinary wet etching or the like to fabricate eight diffraction gratings 88 having a depth of 60 nm.

Subsequently, on the substrate 99 with the gratings 88, SiO$_2$ masks are grown for selective growth.

The widths of SiO$_2$ masks are selected as follows. 1) DFB laser region: array interval between 8 arrays=11.5 $\mu$m, Wa=10 $\mu$m, W$_{m1}$=20 $\mu$m, W$_{m2}$=50 $\mu$m, growth region width W$_0$=1.5 $\mu$m; 2) optical multiplexer region: array interval changed from 11.5 $\mu$m to 2.5 $\mu$m in a distance of 300 $\mu$m; growth region width W$_0$=1.5 $\mu$m; mask width W$_{m3}$=1 $\mu$m for all masks in this region; 3) MMI region: growth region width W$_0$=19 $\mu$m, mask width W$_{m4}$=20 $\mu$m; 4) optical amplifier region: growth region width W$_0$=1.5 $\mu$m, mask width W$_{m5}$=60 $\mu$m; 5) optical modulator region: growth region width W$_0$=1.5 $\mu$m, mask width W$_{m6}$=40 $\mu$m.

To fabricate the window structure on both edge surfaces of the device, a 25 $\mu$m wide SiO$_2$ mask 5 is formed on the end surfaces thereof.

On the substrate with these masks, a laminated structure similar to that of the embodiment 1 shown in FIG. 10 is selectively grown by MOVPE or the like. The lamination includes a 1.13 $\mu$m n-type InGaAsP semiconductor layer 11, an n-type InP spacer layer 12, a 1.20 $\mu$m n-type InGaAsP light confining layer 13, a 7-film MQW layer 14 (1.50 $\mu$m InGaAsP well with compressive strain/1.20 $\mu$m InGaAsP barrier), a 1.20 $\mu$m InGaAsP light confining layer 15, and a p-type InP layer 16. The growing process is carried out under a condition of 150 Torr and 650° C.

In this device, the photoluminescence peak wavelength of the MQW layer was obtained as follows. 1) The wavelength can be changed in a range of from 1535 nm to 1550 nm for channels 1 to 8 in the DFB laser region; 2) the PL peak wavelength is 1380 nm for all channels in the optical multiplexer region; 3) 1300 nm in the MMI region; 4) 1542 nm in the optical amplifier region; and 5) 1472 nm in the optical modulator region.

For this device, results of experiments are as follows. In 1) DFB laser region, the gain peak wavelength of the MQW layer can be changed to follow the oscillation wavelength of each channel determined by the period of the diffraction grating. Namely, the detuning quantity (discrepancy between the oscillation wavelength and the gain peak wavelength) can be adjusted to a favorable value of ±10 nm or less for each channel.

After the respective semiconductor layers are fabricated as above, the SiO$_2$ masks are again formed with the mask opening width W$_0$ changed from 1.5 $\mu$m to 5 $\mu$m in 1) DFB laser region, 2) optical amplifier region, and 3) optical modulator region. The SiO$_2$ mask is completely removed from 4) MMI region. In 5) optical multiplexer region, the SiO$_2$ mask is again formed to cover the W$_0$ wide growth region. Using these masks, a embedded waveguide structure is formed by MOVPE in almost the same structure as for the embodiment 1 shown in FIG. 10. That is; the structure including a 3 $\mu$m thick p-type InP embedded clad layer 17 and a 0.3 $\mu$m thick p$^+$-type InGaAs contact layer 18.

Resultantly, an embedded waveguide structure is manufactured in 1) DFB laser region, 2) optical amplifier region, 3) optical modulator region, and 4) MMI region and a high mesa waveguide structure are fabricated in 5) optical multiplexer region.

Thereafter, an SiO$_2$ layer 19 is grown on the entire surface, a current injection windows are grown on an DFB laser region only, and a Cr/Au upper electrode 20 as well as a Cr/Au lower electrode 21 as prescribed are manufactured in an ordinary sputtering process or the like.

Fabricated on the overall surface is an SiO$_2$ layer again and a window is fabricated partially in 1) DFB laser region as shown in FIG. 19. And windows are also fabricated in 2) optical amplifier region, 3) optical modulator region, and 4) MMI region. A Cr/Au upper electrode 20 is again manufactured. Namely, to prevent the electrodes of the respective channels from being brought into contact with each other, there is provided a double electrode structure of the electrode 20.

In a final process to manufacture a 25 $\mu$m long window structure on both edge surfaces after the fabrication of the electrodes, a resonator region having a length of 1500 $\mu$m is cleaved and then a low-reflection coating SiON film 23 is formed on both edge surfaces of the cleaved item in an ordinary sputtering or the like. As a result, there is advantageously manufactured a wavelength selective light source with quite a small size, i.e., the overall chip size is 80 $\mu$m×1500 $\mu$m.

Since each DFB laser is appropriately detuned in the different wavelength DFB laser array of the light source, there can be obtained appropriate and uniform characteristics for each laser: light output power 20 mW±1 mW @150 mA under condition of oscillation wavelength=1536 nm to 1547.2 nm, 25° C. for all channels, continuous-wave (CW) threshold current=9 mA±11 mA and injection current to optical amplifier=20 mA.

Additionally, as the optical modulator has a modulation characteristic of 2.5 Gbits/s-600 Km transmission for the oscillation wavelengths of all channels. To the adoption of the window structure on both edge surfaces and the low-reflection coating thereon, a single-mode oscillation can be obtained in each channel, and the yield is advantageously 50% or more.

In the description of the first embodiment of the present invention, the semiconductor laser of micro-array distribution feedback (DFB) type is detuned to an appropriate value of ±10 nm. However, the present invention can be effectively employed even when the DFB laser of the first embodiment is replaced with a DBR laser, a DR laser, a laser of gain coupling type, or the like.

In conjunction with the second embodiment of the present invention, there has been described a micro-array multiwavelength semiconductor laser including a spot size converter. However, the present invention is effectively applicable even when the semiconductor laser of the second embodiment is substituted to a DFB laser including a diffraction grating, a DBR laser, a DR laser, a laser of gain coupling type, or the like.

The micro-array semiconductor optical amplifier including a spot size converter described as the third embodiment of the present invention can be coupled with an optical fiber or the like with a low coupling loss. Consequently, when the optical amplifier is combined with a fiber grating to form a single-mode laser of external resonator type, the overall device size can be quite efficiently minimized.

In addition, it is possible to couple the optical amplifier with a quartz-based planar lightwave circuit (PLC) with a low coupling loss. Therefore, the optical amplifier can be quite effectively used with such a PLC in a hybrid configuration to form a functional device. For example, when the micro-array semiconductor amplifier of the third embodiment is combined in a hybrid configuration with a quartz-based PLC including diffraction gratings having mutually different period described in "1997 IEICE Electronics Society Transactions 1 C-3-103", there can be implemented a different wavelength single-mode laser of external resonator type with a controlled longitudinal mode of which the device size is reduced to be ¹⁄₁₀ or less when compared with the conventional device.

The present invention is also efficiently utilized to manufacture a semiconductor laser array in which lights propagating through optical waveguides of the array mutually interfere with each other to thereby cause the array to oscillated as the whose in one transverse mode, i.e., a super-mode.

It is also possible to effectively apply the present invention to fabrication of an integrated optical device including such materials other than the InGaAsP/InP-based materials, for example, an InGaAsN/GaAs-based or InGaAlAs/InGaAsP-based substance as well as to a selective growth process to manufacture the same.

Furthermore, the present invention has been described in relation to an example in which a waveguide is selectively grown with the opening width of the $SiO_2$ mask set to 1.5 $\mu$m. However, the present invention can also be efficiently applied to a selective growth process in which the selective growth $SiO_2$ mask includes an opening width exceeding 1.5 $\mu$m.

In accordance with the present invention, the array size is remarkably minimized by particularly and appropriately adjusting the widths of the dielectric thin layers. Moreover, the composition and the layer thickness vary between the adjacent waveguides of the array, which advantageously leads to a semiconductor waveguide array having a uniform optical device characteristic. Therefore, in accordance with the method of manufacturing the semiconductor waveguide array and the array-structured semiconductor optical device of the present invention, there is attained a super-high integration density so that array size is reduced to ¹⁄₁₀ or less when compared with the conventional method and device. This means that the yield of any array-structured semiconductor optical devices per wafer is improved to ten times that of the prior art and hence the present invention can be advantageously put to practices to supply such array-structured semiconductor optical devices at a low cost.

Moreover, in accordance with the conventional array-structured semiconductor optical device in a super-high integration with an array interval of 50 $\mu$m or less, it is technologically difficult to arbitrarily control the band gap energy of each waveguide layer of the array. However, in accordance with the present invention, the band gap energy of each waveguide layer of the array can be arbitrarily controlled, for example, the energy can be uniformly or linearly changed. Consequently, it is possible to uniform and improve characteristics of the array-structured semiconductor optical device including diffraction gratings and the like in a super-high integration.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A method of manufacturing a semiconductor optical waveguide array including a plurality of optical waveguides in an array structure in stripe-shaped growth regions enclosed by dielectric thin films on a substrate, the optical waveguide being fabricated through a selective crystal growth and having a semiconductor multilayer structure including a quantum well layer or a semiconductor multilayer structure including a bulk layer, comprising the following steps of:

on an occasion of fabricating a plurality of stripe-shaped growth regions elongated parallel to each other, the regions being enclosed with dielectric thin films and selectively growing in each of the growth regions by metallo-organic vapor phase epitaxy a semiconductor multilayer structure including a quantum well layer or a semiconductor multilayer structure including a bulk layer;

the growth regions being parallel to each other with an interval therebetween in the selective growing step the interval being less than a diffusion length of a source material in a reactive tube during the crystal growth, the dielectric thin films arranged between the respective growth regions each having a width Wa, a first outer-most dielectric thin film and a second outer-most dielectric thin film arranged respectively outside of outer-most ones of the growth regions respectively having widths $W_{m1}$ and $W_{m2}$, the widths Wa, $W_{m1}$ and $W_{m2}$ satisfying a relationship of $W_{m1}$>Wa and $W_{m2}$>Wa.

2. The method of manufacturing a semiconductor optical waveguide array in accordance with claim 1, further including the step of;

setting the widths $W_{m1}$ and $W_{m2}$ respectively of the first and second outer-most dielectric thin films to values satisfying a condition of $W_{m1} \neq W_{m2}$ and thereby changing composition or a thickness of each of the semiconductor optical waveguides of the array.

3. The method of manufacturing a semiconductor optical waveguide array in accordance with claim 1, further including the step of;

completely covering by a dielectric thin film each of the regions enclosed by the plural growth regions.

4. The method of manufacturing a semiconductor optical waveguide array in accordance with claim 1, further including the step of;

setting an interval between the plural growth regions to 50 $\mu$m or less.

5. The method of manufacturing a semiconductor optical waveguide array in accordance with claim 1, further including the step of;

setting a length of each of the plural growth regions to 10 $\mu$m or less.

6. The method of manufacturing a semiconductor optical waveguide array in accordance with claim 1, further including the step of;

changing either one of a number of the growth regions and the widths Wa, $W_{m1}$ and $W_{m2}$ of the dielectric thin films in a longitudinal direction of the growth regions and thereby changing composition or a thickness of each of the semiconductor optical waveguides of the array in the longitudinal direction.

7. The method of manufacturing a semiconductor optical waveguide array in accordance with claim 1, further including the step of;

changing each interval between the plural growth regions in a longitudinal direction of the growth regions and thereby changing an interval between the semiconductor optical waveguides.

8. The method of manufacturing a semiconductor optical waveguide array in accordance with claim 1, further including the step of;

setting at least either one of a width of each of the growth regions, a width of each of the growth regions, and the widths Wa, $W_{m1}$ and $W_{m2}$ of the dielectric thin films to vary between semiconductor optical waveguide arrays formed on the substrate.

* * * * *